United States Patent
Judy

(10) Patent No.: US 8,859,913 B2
(45) Date of Patent: Oct. 14, 2014

(54) PORTABLE ELECTROMAGNETIC INTERFERENCE SHIELD WITH FLEXIBLE CAVITY

(71) Applicant: Ryan Judy, Santa Barbara, CA (US)

(72) Inventor: Ryan Judy, Santa Barbara, CA (US)

(73) Assignee: E. C. Ryan International, Inc., Santa Barbara, CA (US)

( * ) Notice: Subject to any disclaimer, the term of this patent is extended or adjusted under 35 U.S.C. 154(b) by 0 days.

(21) Appl. No.: 13/923,255

(22) Filed: Jun. 20, 2013

(65) Prior Publication Data

US 2013/0277101 A1 Oct. 24, 2013

Related U.S. Application Data

(63) Continuation-in-part of application No. 13/471,246, filed on May 14, 2012.

(60) Provisional application No. 61/486,124, filed on May 13, 2011, provisional application No. 61/824,317, filed on May 16, 2013.

(51) Int. Cl.
 *H05K 9/00* (2006.01)

(52) U.S. Cl.
 CPC .................... *H05K 9/0043* (2013.01)
 USPC ............ 174/378; 174/382; 206/720

(58) Field of Classification Search
 CPC .................................... H05K 9/0043
 USPC .................. 174/382, 378; 361/818; 206/720
 See application file for complete search history.

(56) References Cited

U.S. PATENT DOCUMENTS

| | | | |
|---|---|---|---|
| 4,156,146 A * | 5/1979 | Imai et al. ................ | 250/516.1 |
| 4,658,958 A | 4/1987 | McNulty et al. | |
| 5,136,119 A | 8/1992 | Leyland | |
| 5,594,200 A | 1/1997 | Ramsey | |
| 5,791,485 A | 8/1998 | Carbonneau | |
| 5,981,103 A | 11/1999 | Batten, Jr. et al. | |
| 6,438,685 B1 * | 8/2002 | Brower et al. ................ | 713/1 |
| 7,075,798 B2 | 7/2006 | Hendrickson | |
| 7,601,921 B2 | 10/2009 | Schroader | |
| 8,294,044 B2 | 10/2012 | Ramsey | |
| 2003/0057131 A1 | 3/2003 | Diaferia | |
| 2005/0118366 A1 | 6/2005 | Piemonte et al. | |
| 2006/0037156 A1 | 2/2006 | VanHulzen | |
| 2006/0044206 A1 | 3/2006 | Moskowitz et al. | |
| 2006/0254815 A1 | 11/2006 | Humphrey et al. | |
| 2007/0034406 A1 | 2/2007 | Schroader | |
| 2007/0142103 A1 | 6/2007 | Livine | |
| 2008/0268924 A1 | 10/2008 | Chang | |
| 2010/0270070 A1 | 10/2010 | Bradley | |
| 2011/0232956 A1* | 9/2011 | Ramsey ................ | 174/382 |
| 2012/0228020 A1 | 9/2012 | Winch et al. | |

FOREIGN PATENT DOCUMENTS

JP 03017726 1/1991
WO WO 2008/134753 11/2008

* cited by examiner

*Primary Examiner* — Hung Ngo
(74) *Attorney, Agent, or Firm* — Cislo & Thomas, LLP

(57) ABSTRACT

An electromagnetic interference shield having a main enclosure and at least one auxiliary enclosure. The auxiliary enclosure in the main enclosure and an interior that is continuous with each other. The auxiliary enclosure is made of elastic Faraday material. The outer layer and inner layer may be transparent to view the electronic device. An auxiliary cable with filtering mechanisms may be provided inside a sleeve to allow access and transfer of data from the electronic device while still in the main enclosure.

12 Claims, 14 Drawing Sheets

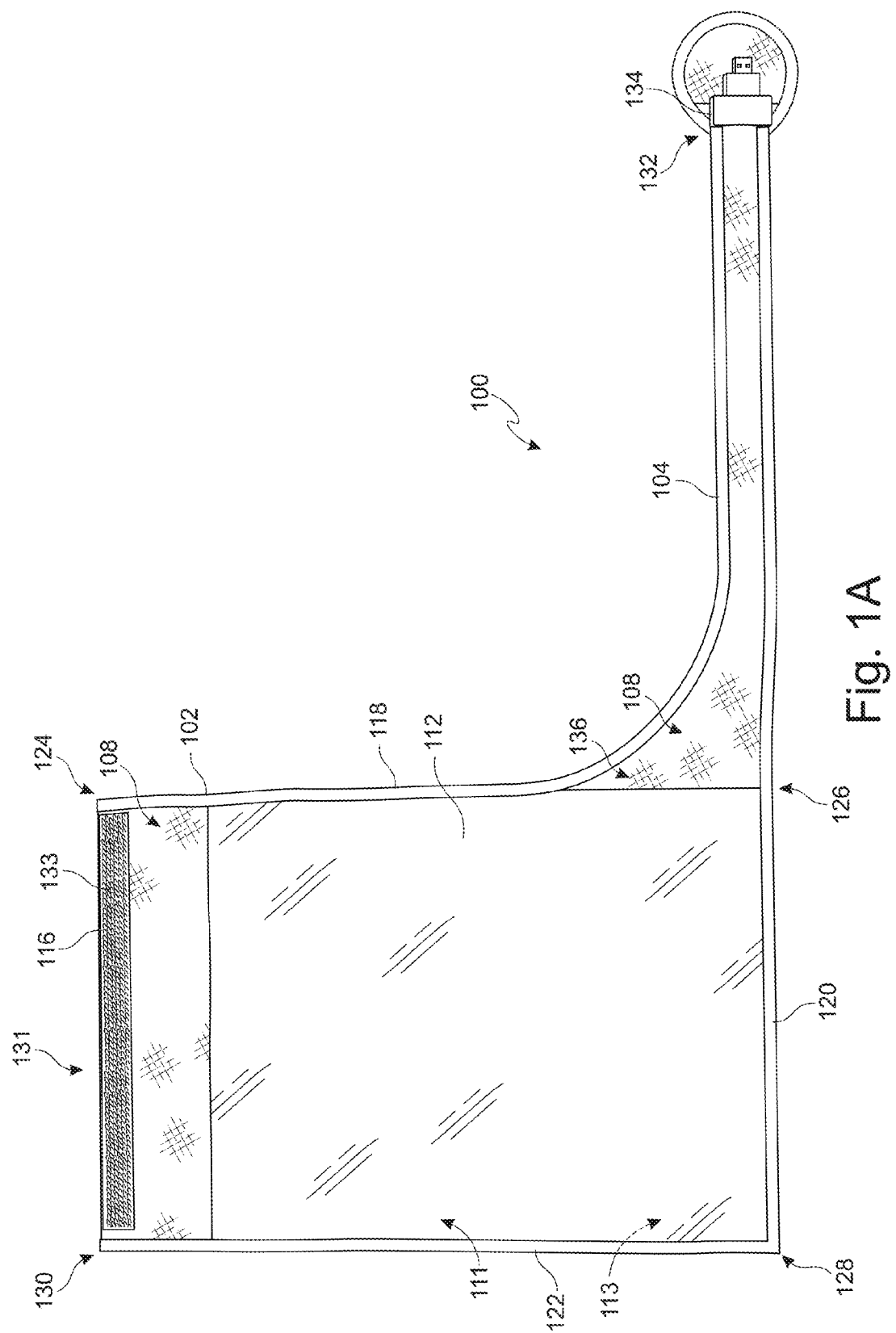

PORTABLE ELECTROMAGNETIC INTERFERENCE SHIELD WITH FLEXIBLE CAVITY

CROSS-REFERENCE TO RELATED APPLICATION

This patent application is a continuation-in-part of U.S. patent application Ser. No. 13/471,246, filed May 14, 2012, entitled "Portable Electromagnetic Interference Shield," which claims the benefit of U.S. Provisional Patent Application No. 61/486,124, entitled "Portable EMI Shield," filed May 13, 2011, and claims the benefit of U.S. Provisional Patent Application No. 61/824,317, filed May 16, 2013, entitled "Portable Electromagnetic Interference Shield with Flexible Cavity", which applications are incorporated in their entirety here by this reference.

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

TECHNICAL FIELD

This invention relates generally to electromagnetic interference (EMI) enclosures, and more specifically relates to portable EMI enclosures for use in shielding electronics from EMI and wireless communication signals.

BACKGROUND ART

EMI shields are useful for many purposes, specifically for protecting forensic evidence. If a portable wireless device is taken from its owner it is important to ensure that the data on the device is not altered in any way from the point of seizure. One method of ensuring this is to shield the device from incoming or outgoing wireless signals using a portable EMI enclosure. It is often desirable to access the device inside of the EMI enclosure to forensically analyze the data it contains while keeping the evidence shielded from EMI signals. It may also be desirable to charge the device while inside of the EMI enclosure.

Prior to this invention, portable EMI enclosures did not provide a method for maintaining EMI shielding while accessing the device inside via cable for either data acquisition, charging, or both. Thus, there is a need for a method of accessing and connecting to a portable wireless device via cable while it is inside of a portable EMI enclosure, without compromising the shielding.

It is also desirable, or sometimes necessary, to manually operate a device inside of a portable EMI enclosure. Portable wireless devices with touchscreens are particularly problematic to operate inside of portable EMI enclosures. Thus, there is also a need for a method of operating portable wireless devices with touchscreens inside of portable EMI enclosures.

Portable EMI shields that allow one to preview devices contained therein shield EMI signals less effectively than portable EMI enclosures that do not allow one to preview the devices contained inside. This is most often noticed when transporting wireless devices inside of EMI enclosures. The reason why this is most often noticed during transport is because it is at this time that a portable wireless device could come close to a signal tower. The closer a wireless device is to a signal tower, the better chance it will have of connecting with the signal from that tower, rendering the EMI enclosure useless.

EMI enclosures that allow access to a device within the enclosure and shield signals effectively exist but they are not portable. They are heavy, metal-lined enclosures as in U.S. Pat. No. 5,594,200 to Ramsey.

Many prior art portable EMI enclosures do not allow cable access to a device inside without compromising their shielding. When operated correctly, they are bags that become a sealed container as in U.S. Pat. No. 7,601,921 to Shroader.

Also, prior art portable EMI enclosures do not allow a human to operate a touchscreen device inside, and prior art portable EMI enclosures that allow a preview of devices inside shield less effectively than portable EMI enclosures that do not allow preview.

Usage of touch screen devices inside of Faraday bags or other portable radio frequency shielding enclosures is difficult. The Faraday material (metalized fabric) is capacitive, therefore emulating the touch of a finger and contacting the device screen at multiple points. Solutions exist that provide methods of usage, but they are generally not efficient.

For example, one device includes a block of foam surrounding a touch screen device, which holds the Faraday material above the screen. A finger is pushed into the center of the foam, against the Faraday material, which contacts the screen at a single point. However, sliding a finger or another device across such an interface would be difficult.

In another device, a hard-sided RF shielding enclosure categorized as "non-portable" device is used. Although efficient, these methods are cumbersome. For example, a hard-sided RF shielding isolation box mated with two gloves allows the user to place his hands inside of the gloves, and is able to operate a device inside of the box. However, the gloves are double-layered, and form-fitting to a hand. They are not efficient to use on touch screens due to the one-size-fits-all glove format, which leaves loose fabric at fingertips for smaller hands. When extra fabric bunches at the fingertips, multiple points of contact are made on the device screen. The double layer of fabric adds to the problem by reducing the ability to accurately contact the screen.

In another device a user can place her hands inside of the Faraday box through a sleeve. Sleeves formed from Faraday material contact the user's arms directly. However, this system is not ideal as it offers the potential for radio frequencies to enter the box when the user's arms are removed from the sleeves.

Furthermore, none of the existing devices address the ability to open and close the RF shielding device to insert or remove additional devices to the shielding device without compromising an existing electronic device already in the shielding device. Current RF shielding enclosures, both portable and non-portable, are built with a single cavity. Devices placed inside of the cavity will no longer be shielded from signals when the cavity is reopened. This limits the ability of the operator to place other devices inside of the cavity, such as a stylus to operate the device more effectively, a battery to provide auxiliary power, or a forensic product that can extract information from the device.

Finally, current RF shielding enclosures, both portable and non-portable, are designed with a static form-factor. Non-portable enclosures are typically made with rigid materials, which are neither flexible nor expandable. Portable enclosures typically have two or three sides, which may be flexible, but not expandable. If an irregularly shaped object is placed inside of the enclosure, it may not fit correctly. Examples of these types of objects may be a phone with a power source connected to it, a router with antenna, or a tablet with a bulky case.

DISCLOSURE OF INVENTION

The present invention relates to an EMI shield comprised of a main enclosure and an auxiliary enclosure, both of which are properly constructed to shield an electronic device from EMI. The auxiliary enclosure is made from elastic material that possesses shielding properties to prevent EMI from reaching an electronic device in the main enclosure or auxiliary enclosure. In the preferred embodiment, the auxiliary enclosure is in the form of a pouch. The pouch configuration provides a cost-effective design that is easy to use and provides the most versatility of features.

The auxiliary enclosure is also fastened to the main enclosure in a way that prevents EMI from entering the main enclosure through the seams used to attach the auxiliary enclosure to the main enclosure. In some embodiments, the auxiliary enclosure may be integrally formed with the main enclosure.

Both the main enclosure and the auxiliary enclosure are made of flexible material to accommodate electronic devices of irregular shapes or particularly large for bulky items.

BRIEF DESCRIPTION OF DRAWINGS

FIG. 1A is a perspective view of an embodiment of the EMI shield according to the present invention.

BEST MODE FOR CARRYING OUT THE INVENTION

Figure 1B:
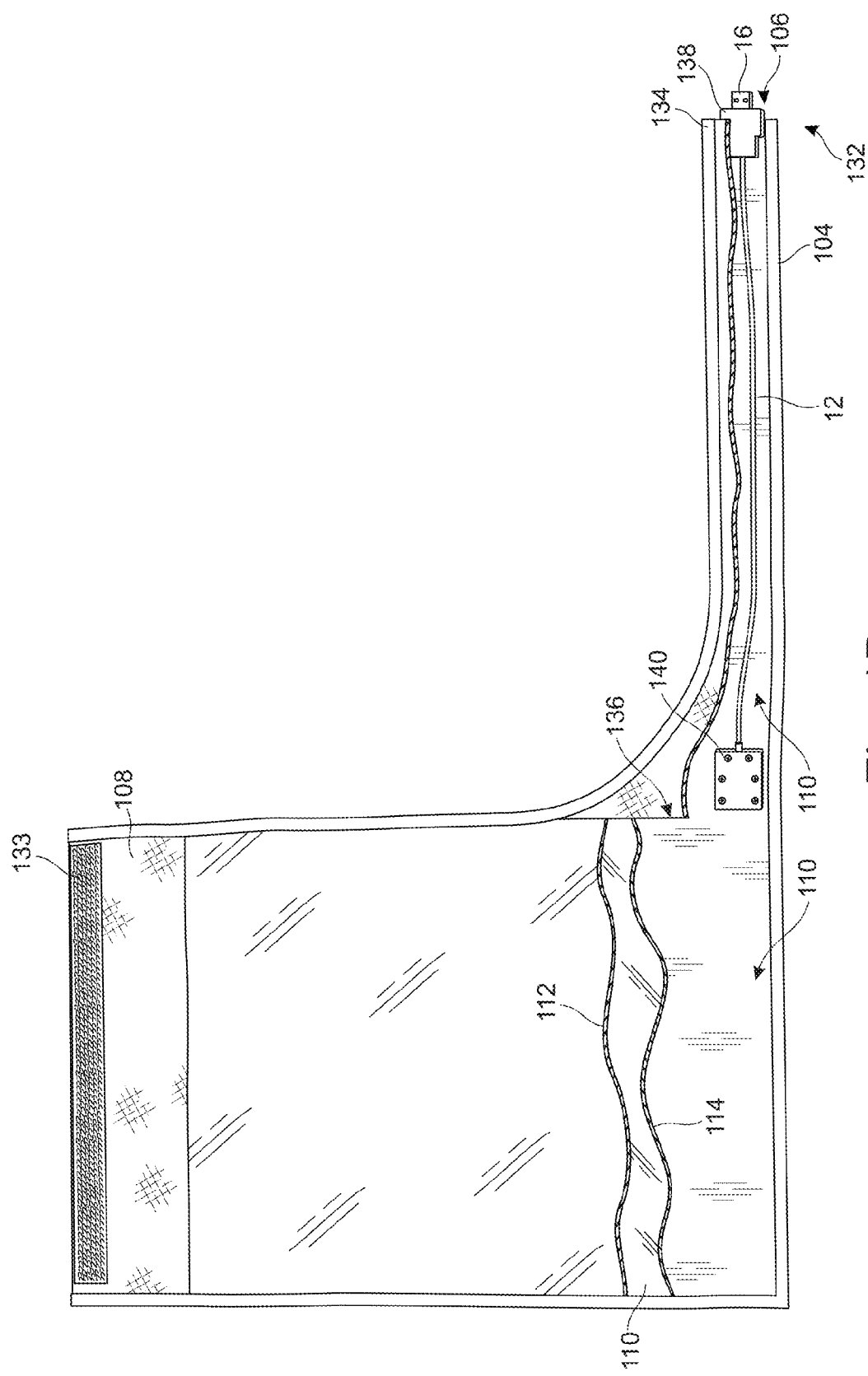
FIG. 1B is the EMI shield in FIG. 1A with a portion of the protective layer and the shielding layer lifted up and/or removed for clarity.

The detailed description set forth below in connection with the appended drawings is intended as a description of presently-preferred embodiments of the invention and is not intended to represent the only forms in which the present invention may be constructed or utilized. The description sets forth the functions and the sequence of steps for constructing and operating the invention in connection with the illustrated embodiments. However, it is to be understood that the same or equivalent functions and sequences may be accomplished by different embodiments that are also intended to be encompassed within the spirit and scope of the invention.

The present invention is a shielding device or EMI shield 100 to protect electronic devices 10 from electromagnetic interference, radiofrequency interference, and any other wireless signals (generally referred to as EMI) that may interfere with, modify, or otherwise, compromise information stored, received, or transmitted by an electronic device 10. The EMI shield 100 comprises a main enclosure 102 capable of fully covering or enclosing the electronic device 10. In some embodiments, the EMI shield 100 may further comprise a means for accessing and connecting to the electronic device with an auxiliary cable 12. For example, the means for accessing and connecting to the electronic device 10 with an auxiliary cable 12 may be a sleeve 104 connected to or integrally formed with the enclosure 102. The sleeve may have a hole 106 or tunnel through which the auxiliary cable 12 can be fed, or the hole 106 may be directly on the enclosure 102 itself.

The enclosure 102 provides the shielding effect to the electronic device 10. With reference to FIGS. 1A and 1B, the enclosure 102 may include an outer layer or protective layer 108 and an inner layer or shielding layer 110. The protective layer 108 provides protection to the electronic device 10 as well as the shielding layer 110. In some embodiments, the protective layer 108 may be made of a durable, but flexible material such as canvas, nylon, leather, and the like. In some embodiments, the protective layer 108 may be made of a more sturdy material such as foam. In some embodiments, the protective layer 108 may be made of a hard material such as metal or plastic. Therefore, in the embodiments utilizing sturdy or hard materials, the enclosure may have the appearance of a box or a clamshell container, whereas the flexible embodiments may be more like bags. However, the enclosure 102, whether flexible, sturdy, or hard, can take on any shape, such as round, oval, triangular, rectangular, and the like.

In some embodiments, the enclosure 102 is made up of a durable fabric protective layer 108, such as canvas having a generally rectangle shape with two opposing surfaces 111, 113 defined by four sides 116, 118, 120, 122 connected to each other to form four corners 124, 126, 128, 130. The protective layer 108 can be a single layer folded on top of itself and fastened at three of the four sides 118, 120, 122, with one side 116 remaining unfastened so as to define an opening 131. The open side 116 may comprise a fastening mechanism 133, such as a hook and loop fastener, zipper, adhesive, buttons, and the like so that the opening 131 can be closed. In some embodiments, a strip of the hook portion 133a may be on the first surface 111 along the length of the top side 116, and a strip of the loop portion 133b approximately the same length as the loop portion 133b may be on the second surface 113, but shifted towards the opposite side 120. The distance of the shift may be just over two widths of the strip so that when the strip of the hook portion 133a is folded over towards the second surface 113 twice, the strip of the hook portion 133a mates with the strip of the loop portion 133b. In some embodiments, the fastening mechanism 133 may be on the inner surface of the enclosure at the top side 116 so that the inner surfaces of the enclosure 102 are mated together. In some embodiments, the fastening mechanism 133 may be on the outer surface and the inner surface to provide a dual fastening system.

In some embodiments, two separate protective layers 108 may be fastened together at three sides 118, 120, 122 to form the enclosure having an opening 131 at one side 116.

The shielding layer 110 may comprise one or more layers of a metalized fabric, or other materials that can block EMI. The shielding layer 110 may have an opening that can be closed or opened to allow electronic devices to enter or exit the enclosure 102. Essentially, the shielding layer 110 lines the interior of the enclosure 102. In some embodiments, the shielding layer 110 may be loosely placed inside the enclosure 102. Therefore, the shielding layer 110 may simply be a pouch much like the enclosure 102, but slightly smaller to fit inside the enclosure 102. In some embodiments, the shielding layer 110 may be stitched, glued, or otherwise fastened to the inner side of the enclosure 102. In the preferred embodiment, to prevent any leaks or gaps in the shielding, the shielding layer 110 should be coextensive with the dimensions of the enclosure 102. In addition, the sealed sides 118, 120, 122 may be folded over and sealed to create an overlap of the shielding layer 110 at the sides 118, 120, 122 to prevent any gaps.

To allow the electronic device 10 to be previewed or operated, a portion of one surface 111 of the enclosure 102 may have a transparent portion or window 112. This window 112 may be comprised of a transparent protective layer made of a clear or see-through plastic, rubber, silicon, glass, and the like. In embodiments having a transparent window 112, the shielding layer 110 must also have a transparent window or transparent portion 114 overlapping with the transparent window 112 of the enclosure so that the transparent portion 114 permits the device 10 to be seen while the transparent window 112 provides a protective covering for the transparent portion 114 of the shielding layer 110. To create a portion of the shielding layer 110 that is transparent while still providing a shielding effect, the thread count of the metallized fabric of the shielding layer 110 may be lowered relative to an opaque shielding layer. The transparent window 112 or the transparent portion 114 does not necessarily have to be completely transparent so long as electronic device 10 is visible enough to operate while in the enclosure 102.

To permit access to the electronic device 10 while still in the enclosure 102, the enclosure may have a hole 106. In some embodiments, the hole 106 may be operatively connected to a hollow sleeve 104. The sleeve 104 may have the same construction as the enclosure 102, namely, the same or similar outer or protective layer 108 and the same or similar inner or shielding layer 110. An auxiliary cable 12 may be inserted through the sleeves 104 and/or the hole 106 to provide a means for connecting to the electronic device 10 inside the enclosure 102.

In the preferred embodiment, a sleeve 104 is operatively associated with the enclosure 102 at one side 118 of the enclosure 102, essentially forming an extension or protrusion of side 118 and/or an extended edge of one side 120 or corner 126 as shown in FIG. 1A. The sleeve 104 may be connected to the sides 118 or the enclosure 102 or the sleeve 104 may be integrally formed as a one-piece unit with the enclosure 102, extending away from the enclosure 102 and terminating at a free end 132. The sleeve 104 can be associated with an enclosure 102 having any other shape.

The free end 132 of the sleeve 104 may comprise a metallic unit 134 that may connect with the shielding layer 110 of metalized fabric as well as the protective layer 108 of material fabric. The metallic unit 134 at the free end 132 of the sleeve 104 is described in further detail below.

Figure 2A:
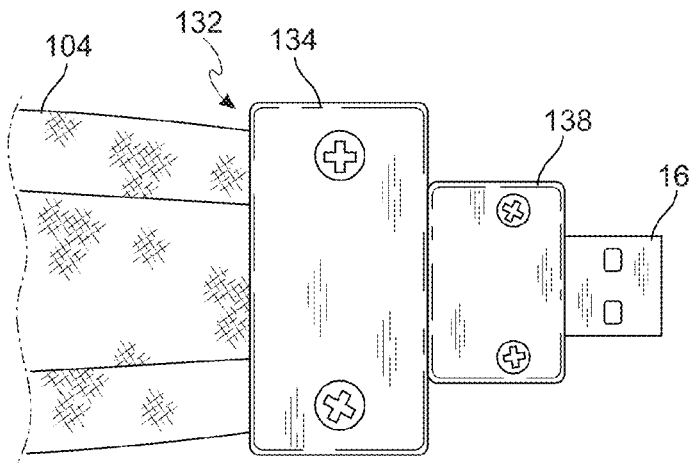
FIG. 2A is a view of the back side of the sleeve of an EMI enclosure according of the present invention, the sleeve terminating with a metallic unit that may connect with the inner layer(s) of metalized fabric as well as the outer layer(s) of protective fabric. The metallic unit may have a hole through it through which an auxiliary cable may protrude. As shown, a USB connection protrudes from the hole.
Figure 2B:
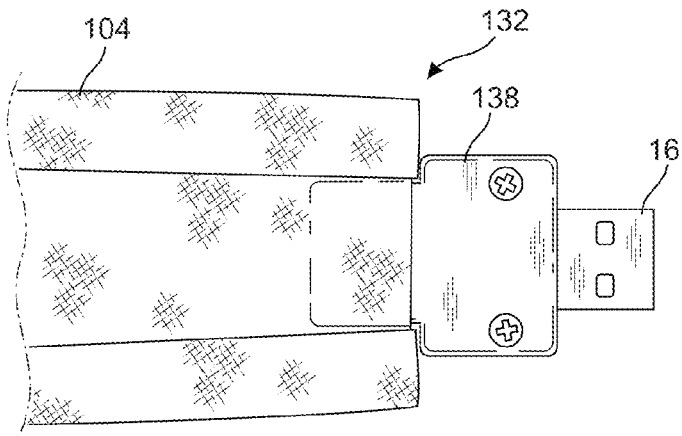
FIG. 2B is a view of the front side of the sleeve of an EMI enclosure according to the present invention with the metallic unit removed, the sleeve having a hole through which an end connection of an auxiliary cable protrudes. As shown, a USB connection protrudes from the hole.
Figure 2C:
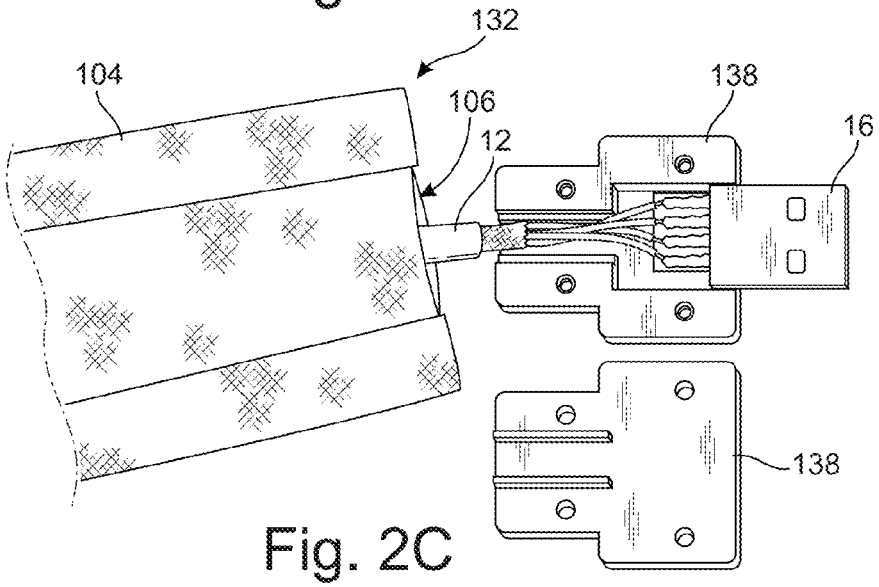
FIG. 2C is a view of the front side of the sleeve of an EMI enclosure according to the present invention with a portion of a connection removed for clarity of the internal structure, the sleeve having a hole through which an auxiliary cable may protrude. As shown, the auxiliary cable includes metalized shielding or an EMI filter which may be spliced at the end and connected with the metallic unit, which in turn contacts the entire EMI enclosure.
Figure 3A:
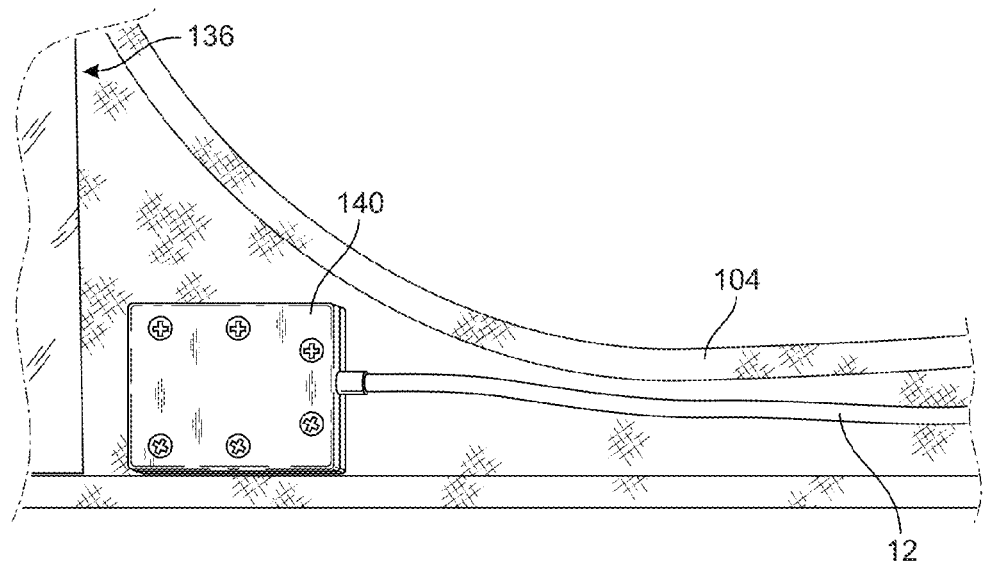
FIG. 3A is a view of the front side of a portion of the embodiment of the EMI enclosure according to the present invention showing the auxiliary cable and filter unit outside of the EMI enclosure.
Figure 3B:
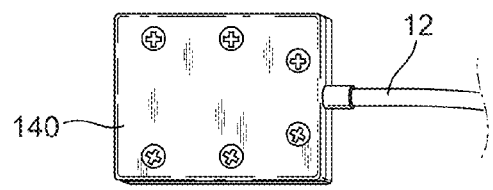
FIG. 3B is a view of the filter enclosure connected to an auxiliary cable that may be a component of the present invention.
Figure 3C:
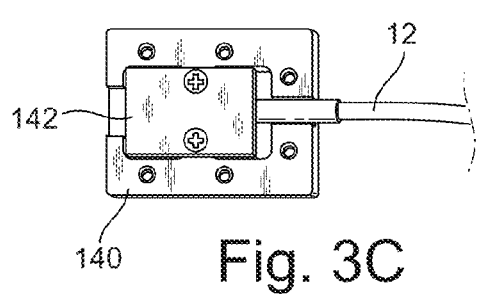
FIG. 3C is a view of the filter enclosure wherein the metallic portion of an auxiliary cable connection is mated to the filter enclosure in such a way that the device cable connection can become part of the complete EMI enclosure according to the present invention.

Cable connections may also be included in the EMI shield 100. As shown in FIGS. 2A-2C, the metallic unit 134 at the free end 132 of the sleeve 104 of the EMI enclosure 100 may include a hole 106 through which a cable-end connection 16 of an auxiliary cable 12 protrudes. In the example in FIGS. 2A-2C, a USB connection protrudes from the hole 106. The metallic portion of the cable-end 16 is mated to the metallic unit 134 in such a way that the cable-end 16 can become part of the complete EMI enclosure 100. The auxiliary cable 12 includes metalized shielding which may be spliced at the end and connected with the metallic unit 134, which in turn contacts the entire EMI enclosure. As shown in FIGS. 1B and 3A, the opposite end of the auxiliary cable 12 runs through the sleeve 104 towards the enclosure 102 and terminates at or near a junction 136 where the sleeve 104 transitions to the enclosure 102.

In some embodiments, a connection 138 protruding from the metallic unit 134 may be connected to the auxiliary cable 12 that is inside of the sleeve 104 of the enclosure 102. This auxiliary cable 12 includes metalized shielding which may be spliced at the end and connected with the connection 138, which in turn contacts the entire EMI enclosure. In such an embodiment, the metallic unit 134 may not be required.

In some embodiments, the auxiliary cable 12 may be configured with the aforementioned metallic unit 134 on one end, as well as a filter enclosure 140 on the opposite end. FIG. 3A shows the opposite end of the auxiliary cable 12 operatively connected to the filter enclosure 140 on the outside of the sleeve 104. The filter enclosure 140 serves as a protective covering for an EMI filter 142.

Figure 3D:
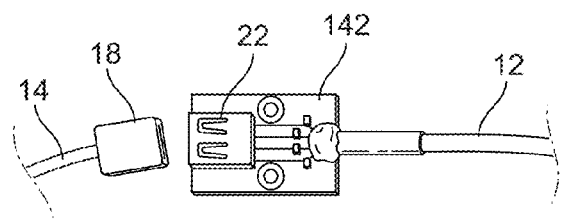
FIG. 3D is a view of small EMI filter that may be placed in between the end connection of a device cable and an auxiliary cable that runs inside of the sleeve of the enclosure according to the present invention.

As shown in FIGS. 3A-3D, a small EMI filter 142 having a connector portion 22 may be placed in between a connector end 18 of the device cable 14 and the auxiliary cable 12 that runs inside of the sleeve 104, to prevent the auxiliary cable 12 from transmitting outside signal to the electronic device 10 inside of the EMI shield 100. The EMI filter 142 may be encased in a filter enclosure 140 that touches the shielding layer 110 of metalized fabric of the enclosure 102. The filter enclosure 140 may be made of metal. The filter enclosure 140 may be connectable with the opposite end of the auxiliary cable 12 that is not already connected to the metallic unit 134. Although FIG. 3D shows the auxiliary cable 12 soldered to the EMI filter 142, the connection may also be removable, by adding another connector portion 24, such as a USB connector, so that the auxiliary cable 12 can be removably connected to the EMI filter 142 as shown in FIG. 4D.

The connector portion 18 of the device cable 14 is mated to the filter enclosure 140 in such a way that the cable connections can become part of the complete EMI shield 100. The connector portion 20 of the device cable 14 opposite connector portion 18 can be connected to the electronic device 10 inside the enclosure 102. Since these connections occur inside of the EMI enclosure 102 the shielding is maintained. The auxiliary cable 12 that extends from the filter enclosure 140 is also connected to the metallic unit 134 on the free end 132 of the sleeve 104. This metallic unit 134 has a cable end-connection 16 which is external to the EMI enclosure 102 and sleeve 104 and can be inserted into another device. This configuration allows the electronic device 10 placed inside of the EMI shield 100 to connect with devices outside of the EMI shield 100 while remaining shielded from EMI signals.

Figure 4A:
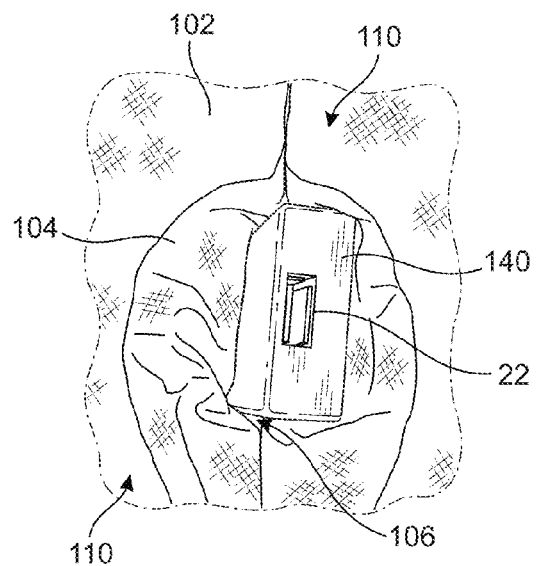
FIG. 4A is a view of the inside of the main enclosure showing a filter enclosure according to the present invention.
Figure 4B:
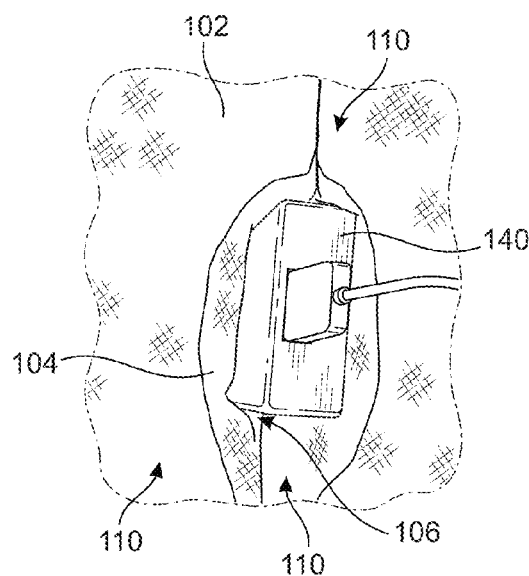
FIG. 4B is the view of FIG. 4A with a device cable connected to the filter enclosure.
Figure 4C:
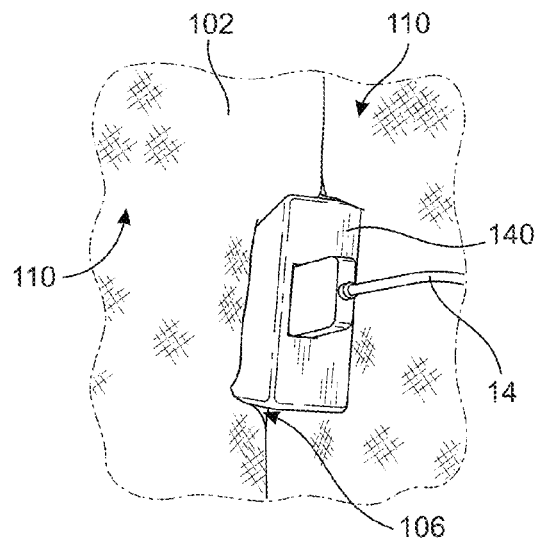
FIG. 4C is a view of another embodiment of the inside of the main enclosure showing a filter enclosure protruding from a hole without a sleeve.
Figure 4D:
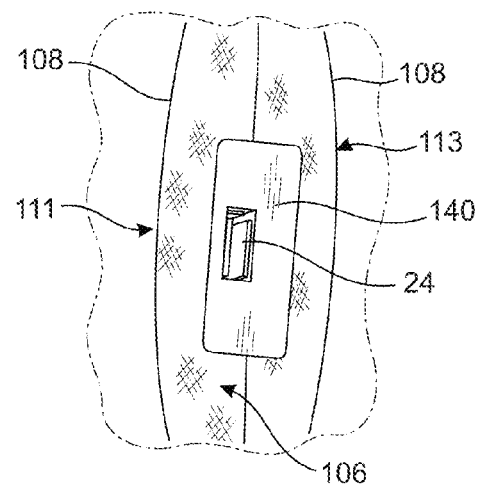
FIG. 4D is a view of the opposite end shown in FIG. 4C of the main enclosure from the outside of the main enclosure.
Figure 4E:
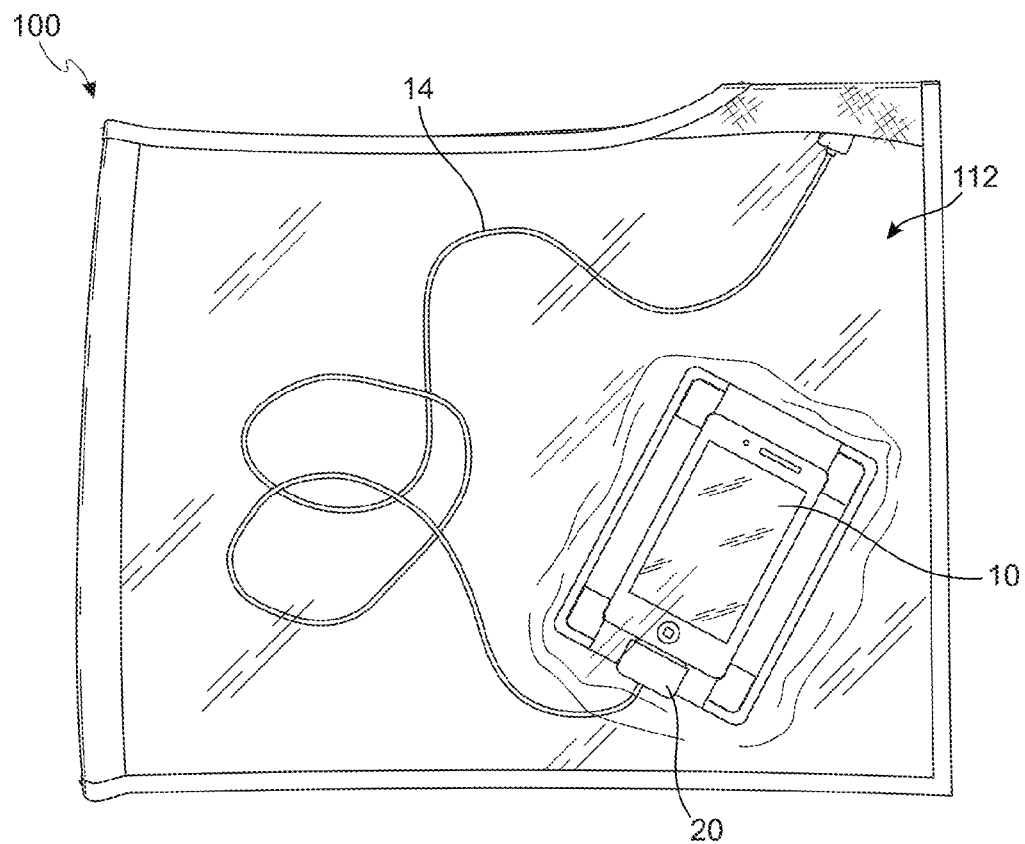
FIG. 4E is a view of the EMI shielding enclosure showing a side with a transparent window, allowing preview of the contents of the enclosure.

As shown in FIGS. 3A and 4A-4D, in the preferred embodiment, the EMI filter 142 and filter enclosure 140 are positioned at the junction 136 where the sleeve 104 transitions to the main enclosure 102. In embodiments without the sleeve 104 the EMI filter 142 and filter enclosure 140 would be at the hole 106 of the main enclosure. Therefore, the filter enclosure 140 and/or the EMI filter 142 itself may be fastened to the main enclosure 102 at the hole 106 with adhesives or other fastening methods so as to effectively seal the hole 106 as shown in FIGS. 4C and 4D. In an embodiment, the EMI filter 142 may have two connector portions 22, 24 at each end instead of one. This allows the auxiliary cable 12 to be removable from the EMI filter 142. Therefore, a device 10 in the main enclosure will still be able to communicate or transmit data to an external device through an auxiliary cable 12 without a sleeve 104.

Manual operation of touchscreen devices inside of an EMI shield has been difficult or impossible. One problem is that the electronic device 10 cannot be seen when inside the enclosure 102. Another problem is that the user cannot touch the touchscreen 20 because it is inside the enclosure 102. A third problem is that when utilizing a flexible material for the transparent windows 112, 114, the transparent portion 114 of the shielding layer 110 will make contact with the touchscreen 20 and possibly cause interference with actuation of the touchscreen 20. Therefore, a means for operating the electronic device from outside the enclosure and a means for preventing the shielding layer 110 from touching the touchscreen 20 of the electronic device 10 may be required. The visibility of the electronic device 10 has been obviated by the transparent windows 112 and 114. A means for operating the electronic device from outside the enclosure and a means for preventing the shielding layer 110 from touching the touchscreen 20 of the electronic device 10 is described below.

Figure 5:
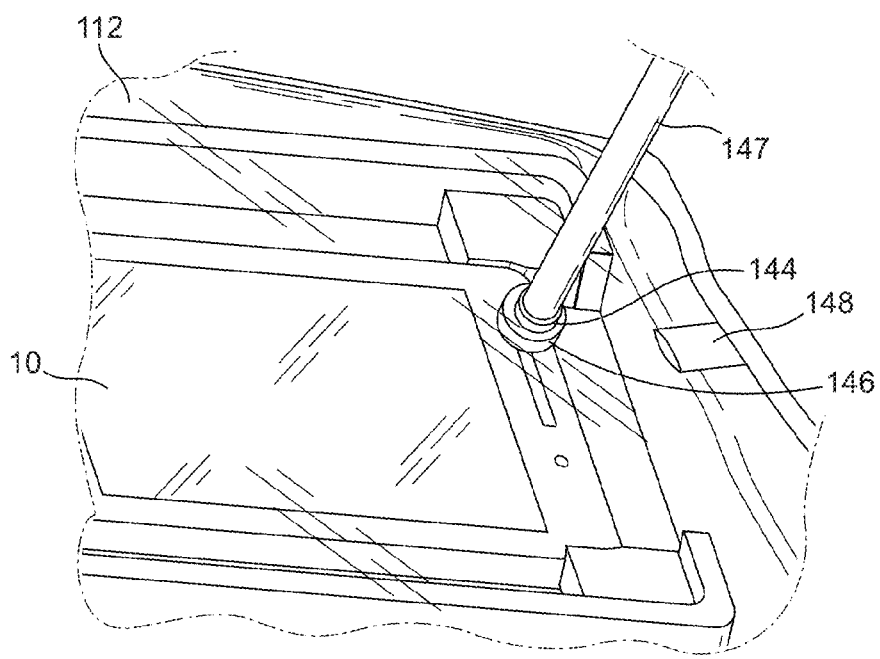
FIG. 5 is a view of an embodiment of the EMI shield of the present invention showing an inner magnet and a stylus with a magnet on the end allowing a user to contact the touchscreen and activate it.

In some embodiments, a means for operating the electronic device 10 from outside the enclosure may be provided, particularly where the electronic device 10 utilizes a touchscreen 20 as a method of input. For example, as shown in FIG. 5, one means for operating the electronic device 10 from outside the enclosure 102 utilizes a magnet system. The magnet system may comprise an external magnet 144 used on the outside of the enclosure 102 and an internal magnet 146 used on the inside of the enclosure 102. The external magnet 144 may be used by the user to control movement of the internal magnet 146 from outside the enclosure 102. The internal magnet 146 makes contact with the electronic device 10, particularly the touchscreen 20, and mimics a user's finger to actuate the touchscreen 20. The internal magnet 146 is placed inside of the EMI enclosure 102 before it is sealed.

To facilitate movement of the external magnet 144, the external magnet 144 may be fixed to an elongated magnet holder 147. The elongated magnet holder 147 may be a pencil or pen-like device, such as a stylus. Using the stylus, with an external magnet 144 on the end, like a pen, the user can move along the outside of the transparent window 112 near the internal magnet 146 inside of the enclosure 102 to connect with the internal magnet 146. Once the two magnets 144, 146 are connected, with the transparent windows 112, 114 between the two magnets 144, 146, the internal magnet 146 can be manipulated by the external magnet 144, which is connected to the stylus. The internal magnet 146, which is of a size suitable for emulating finger touch, contacts the touchscreen 20 and activates it. For example, the inner magnet 146 may be a disk magnet. In the preferred embodiment, the inner magnet 146 has a diameter of approximately 0.25 to approximately 0.5 inch and a thickness of 0.125 inch. Most preferably, the inner magnet 146 has a diameter of approximately 0.375 inch. The shape and configuration also allows the inner magnet 146 to depress buttons on the electronic device 10. The inner magnet 146 should also have smooth edges so as not to damage the electronic device 10 or the shielding layer 110. Because hard drives use rare-earth magnets, the inner magnet 146 should not affect the hard drives.

Preferably, the external magnet 144 of the elongated holder 147 is a spherical magnet with the pole aligned so that it is generally parallel with to the elongated holder 147. The external magnet 144 may be, for example, 0.25 inch in diameter. Preferably, both magnets are nickel plated neodymium magnets.

In some embodiments, a pocket 148 may be created on the transparent portion 114 of the shielding layer 110 or some other portion of the shielding layer 110 so that the internal magnet 146 can be "parked" or stored when not in use without interfering with the touchscreen 20. The pocket 148 should be created on the side of the shielding layer 110 adjacent to the device 10. However, the pocket 148 may be created in between the shielding layer 110 and the protective layer 108.

Figure 6A:
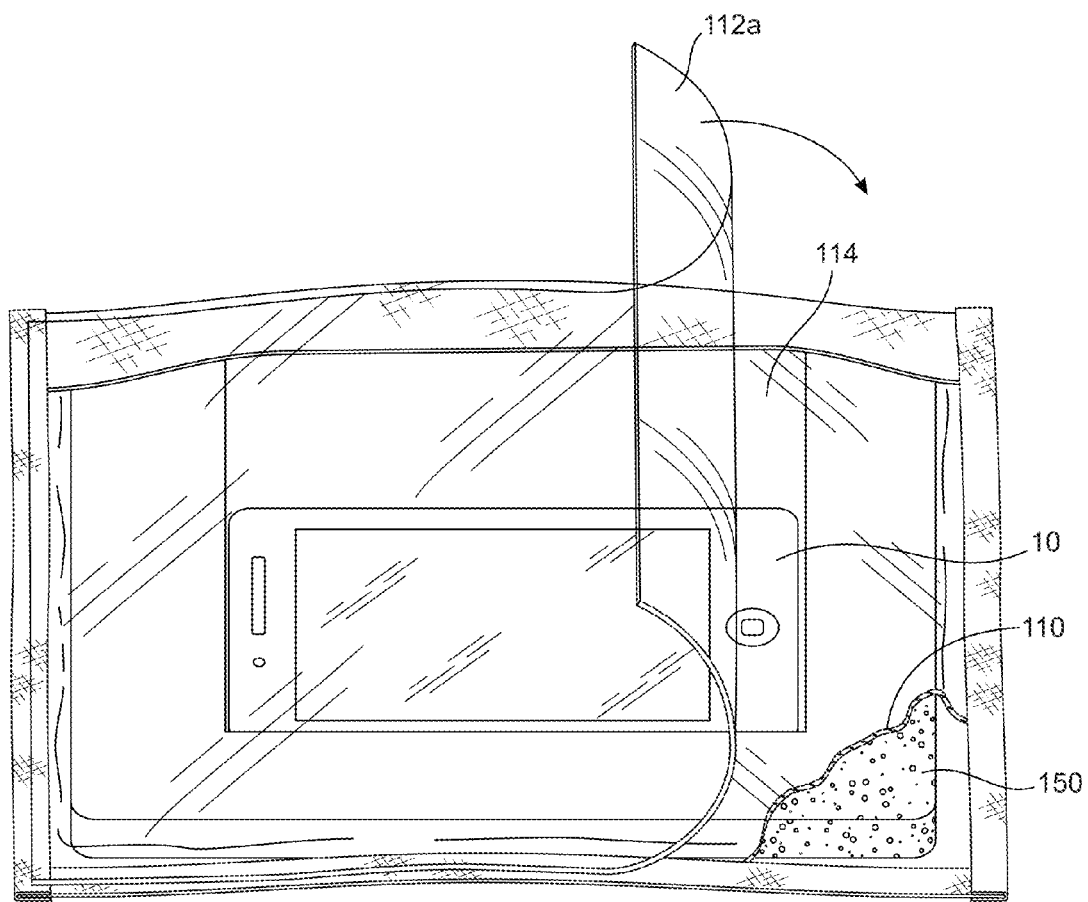
FIG. 6A is another embodiment of the enclosure in the closed configuration.

To further facilitate operating the device 10 in the enclosure 102, the covering 112a for the transparent portion 114 may be removable or separable from the transparent portion 114 as shown in FIG. 6A. For example, the covering 112a may be fastened to one of the sides 116, 118, 120, or 122 of the enclosure 102. This allows the covering 112a the lift up off of the surface of the transparent portion 114 of the shielding layer 110. By removing the covering 112a off of the transparent portion 114 of the shielding layer 110, actuation of the electronic device 10 may be improved. In such an embodiment, the covering 112a does not necessarily have to be a transparent window. Thus, covering 112a can be opaque.

A means for preventing the shielding layer 110 from touching the touchscreen 20 of the electronic device 10 may be one or more firm, rigid, or semi-rigid structural supports 150 to separate the shielding layer 110 from the electronic device 10 and/or the touchscreen 20. Firm and rigid generally means that the structure can maintain its shape, structure, or configuration in its natural state regardless of how it is held or positioned. For example, a sufficiently thick piece of foam, plastic, rubber, metal, wood, and the like will maintain their same shape, structure, or configuration regardless of how they are positioned or held, whereas a rectangular piece of fabric would bend when held at the corner and suspended in the air.

The structural support 150, for example, may be a piece of foam, rubber, plastic, metal, wood, glass, and the like. In the preferred embodiment, the support 150 is made of foam, rubber, or some other firm material that provides some cushioning effect. This prevents the enclosure 102 from making contact with the screen of the electronic device 10. In addition, the support 150 prevents the means for operating the electronic device from unintentionally operating the electronic device 10. Finally, utilizing foam reduces the chance that the enclosure 102 or the electronic device 10 will be damaged since the foam is lightweight and flexible.

Figure 6B:
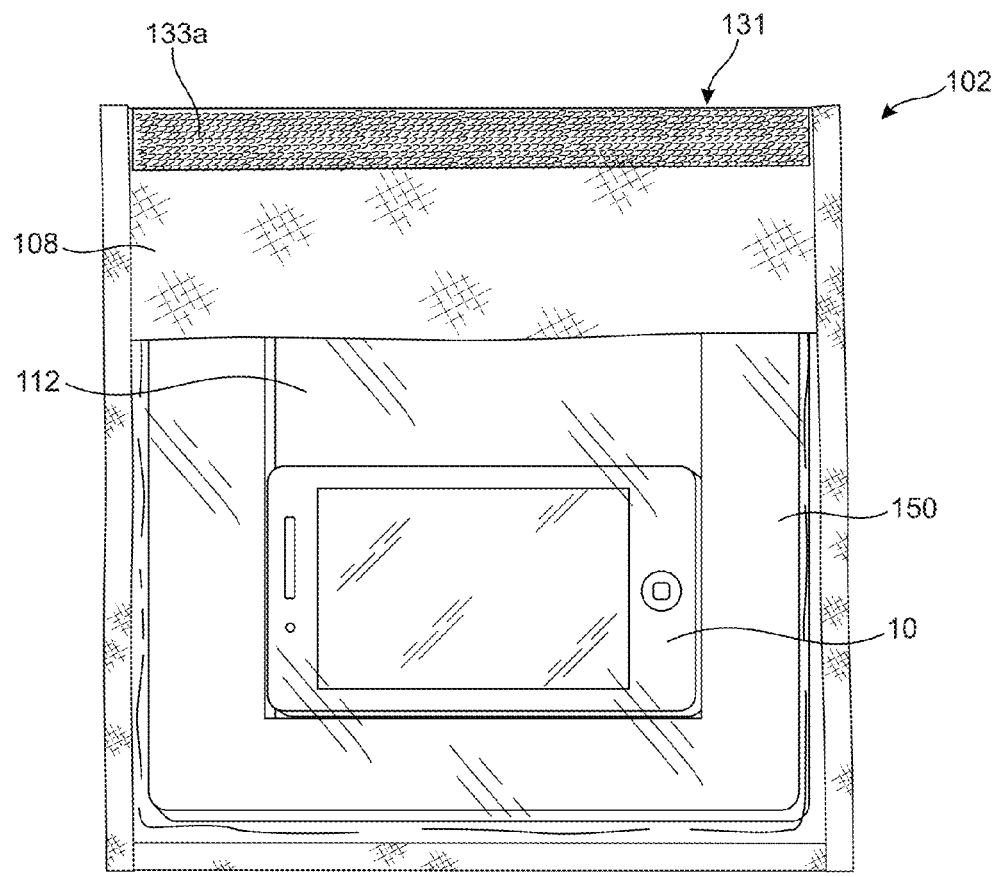
FIG. 6B is the enclosure of FIG. 6A in a partially closed figuration.
Figure 6C:
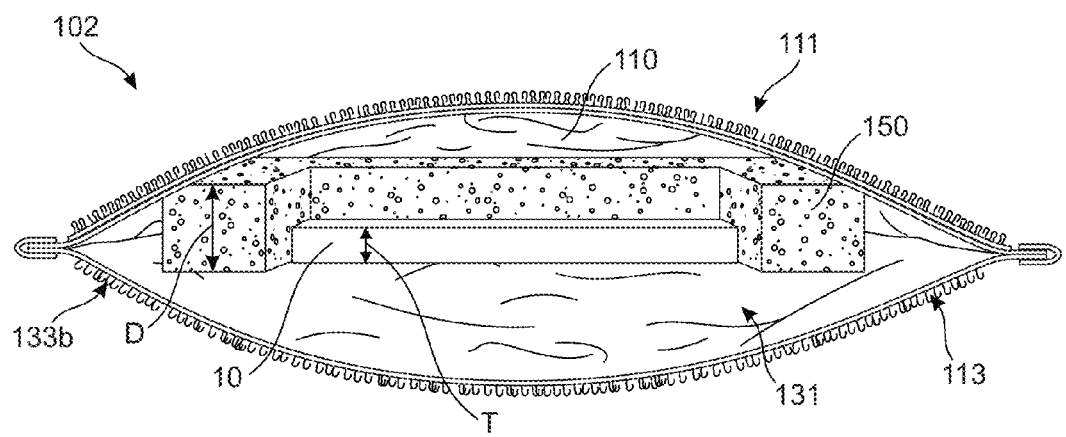
FIG. 6C is the embodiment of the enclosure shown in FIG. 6B in the open configuration.

In some embodiments, the support 150 may be a flexible material having a filling that provides structural firmness or rigidity. For example, the support 150 may be a plastic bag filled with air or water and sealed airtight. The structural support 150 can take on any shape so long as one overall dimension of the support 150, i.e. the height or cross-sectional diameter, is greater than the thickness T of the electronic device 10. For example, the support 150 may be the shape of a block, a ball, a pyramid, a dome, a cylinder, and the like. In the preferred embodiment, the support 150 may be an elongated structure having a round, oval, square, rectangular, triangular, star-shaped, or any other shaped cross-sectional area, wherein one dimension D of the cross-sectional area is greater than the thickness T of the electronic device 10. Therefore, as shown in FIGS. 6B and 6C, when the electronic device 10 is laid flat in the enclosure 102, the support 150 extends upwardly beyond the top surface or touchscreen of the electronic device 10. Due to the firmness or rigidity of the support 150, the support 150 pushes the shielding layer 110 away from the electronic device 10.

One or more structural supports 150 may be used. Preferably, multiple structural supports 150 may be placed inside the enclosure 102 in strategic locations, for example, along one or more of the sides 116, 118, 120, 122, as shown in FIGS. 6A and 6B. The electronic device 10 may be placed in between these supports 150. The supports 150 can be independent or individual pieces that can be inserted and removed from the enclosure 102. In some embodiments, supports 150 may be connectable to the enclosure 102, for example, with hook and loop fasteners, adhesives, and the like. In some embodiments, the supports 150 may be integrally formed with the enclosure 102.

Figure 7:
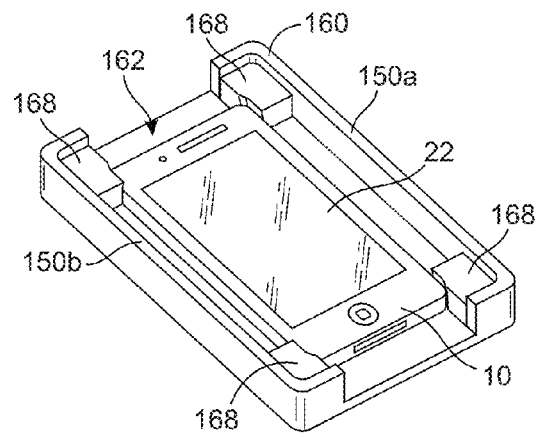
FIG. 7 is a view of a cradle for holding and receiving a touchscreen device inside of an EMI enclosure according to the present invention that prevents the metalized fabric from resting on the touchscreen of the device inside.
Figure 8:
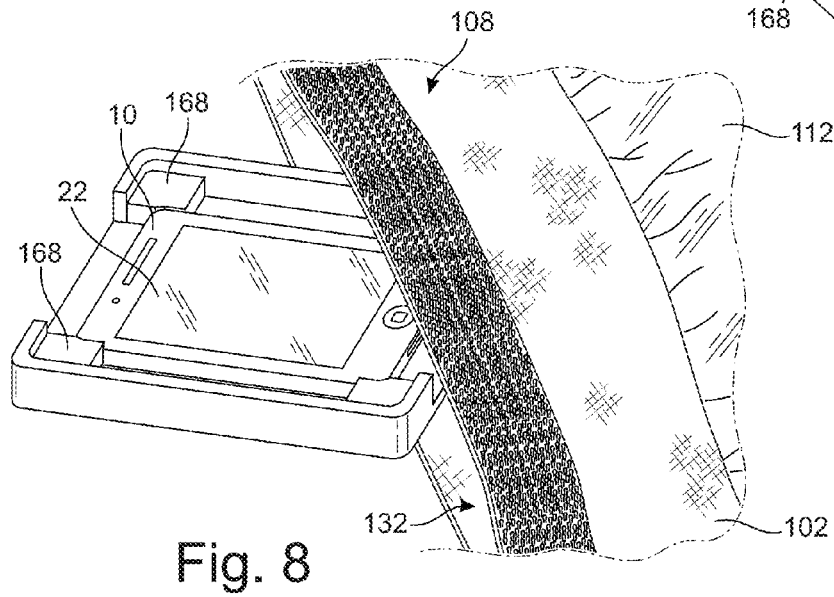
FIG. 8 is a view of the EMI shielding enclosure according to the present invention that shows an opening that can be closed or opened to allow devices to enter or exit the enclosure.

In some embodiments, multiple supports 150a, 150b may be arranged together to form a cradle 160 as shown in FIG. 7. The cradle 160 may be a rigid or semi rigid support having a cavity 162 that receives the electronic device 10. The cavity 162 may be defined by supports 150a, 150b of the cradle 160 that have a height that is greater than the thickness T of the electronic device 10. Therefore, when the electronic device 10 is laid flat in the cavity 162 of the cradle 160, the supports 150a, 150b extend upwardly beyond the top surface or touchscreen of the electronic device 10. The cradle 160 containing the electronic device 10 can be inserted into the enclosure 102. Due to the rigidity of the supports 150a, 150b, the shielding layer 110 is pushed away from the electronic device 10, like that shown in FIG. 6C. Bumpers 168 may be used to secure the electronic device 10 inside the cavity 162 by creating a resistance fit between the electronic device 10 and the supports 150a, 150b of the cradle 160, thereby providing added protection to the electronic device 10. Bumpers 168 may come in a variety of sizes that accommodate devices 10 of varying sizes.

The cradle 160 can be constructed in a variety of ways. For example, the cradle 160 may be constructed from foam, plastic, rubber, wood, glass, metal and the like. The cradle 160 can be a one-piece molded construct. Alternatively, the cradle 160 can be made of multiple pieces connected together.

Figure 9:
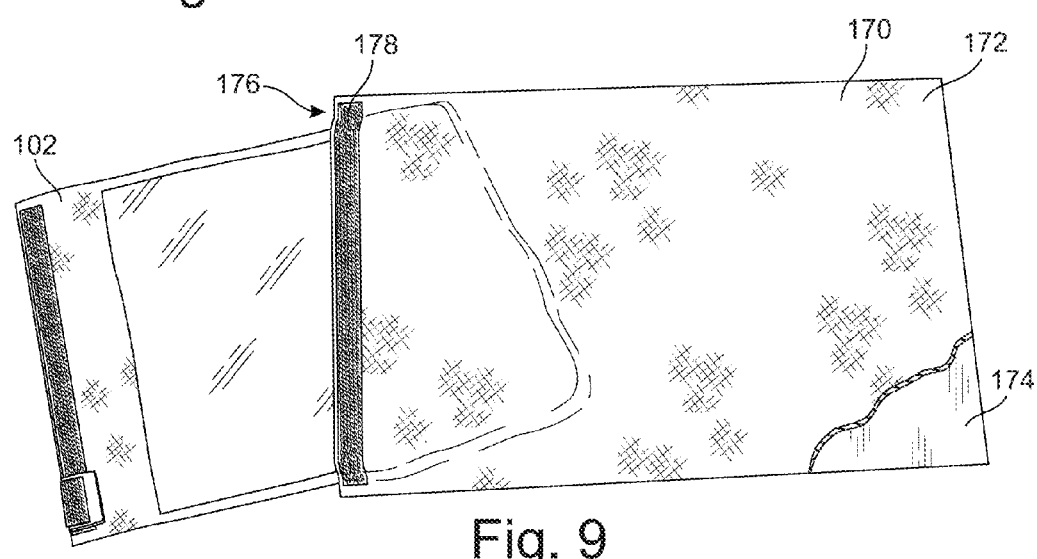
FIG. 9 is a perspective view of an optional secondary EMI enclosure without a preview window in which an EMI enclosure according to the present invention may be placed, the EMI enclosure shown partially placed inside the secondary EMI enclosure.

For additional shielding, the EMI enclosure 102 can be placed inside of a secondary EMI enclosure 170 that may or may not have a transparent window (for example, for transport of the device 10 when it may encounter strong EMI signals from signal towers nearby) as shown in FIG. 9. Like enclosure 102, the secondary enclosure 170 has the same or similar protective layer 172 on the outside, preferably made of canvas or another durable material, and a shielding layer 174 of metalized fabric on the inside. Shielding layer 174 of the secondary enclosure 170 may be opaque and does not require a transparent window. One side of the secondary enclosure 170 is an opening 176 in which devices can enter or exit the secondary enclosure 170. The side with the opening 176 may comprise a closure system 178, such as a zipper, hook and loop fasteners, adhesives, buttons, and the like, similar to the main enclosure 102. When the opening 176 is closed, the secondary enclosure 170 is a fully sealed EMI enclosure without a preview window.

Figure 10:
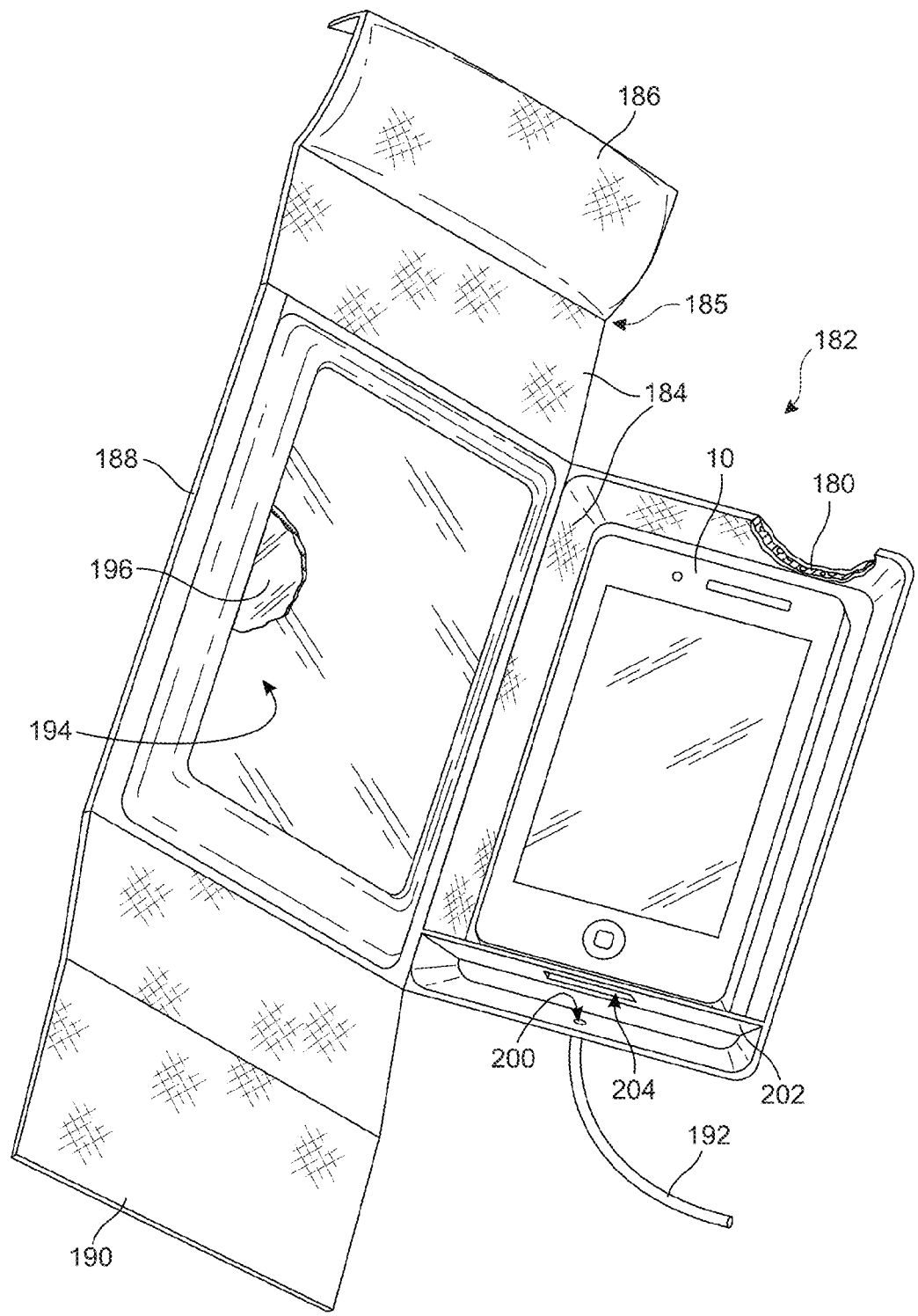
FIG. 10 is a perspective view of another embodiment of the present invention with portions cut away to show various features.

In some embodiments, as shown in FIG. 10, rather than utilizing a flexible fabric material for the enclosure 102, a firm, rigid, or semi-rigid substrate 180 may be used. By way of example only, the substrate 180 may be made from a foam plastic. However, any other firm, rigid, or semi-rigid material can be used, such as wood, glass, metal, rubber, and the like. In the preferred embodiment, the substrate 180 may be a foam plastic laminated to a conductive or metallic fabric 184 and molded into the enclosure 182, having a construction design that allows for the overlap 185 of conductive fabric 184 at the seams and other, non-integral portions of the enclosure construction, such that when the enclosure 182 is closed properly it creates a signal-shielding 'Faraday cage.'

The edges 186, 188, 190 of the laminated material 184 overlap to form a continuous metallic surface around the contents of the enclosure 182, effectively shielding devices and other contents inside of the enclosure 182 from incoming signals and preventing signals from the devices inside the enclosure 182 from escaping the enclosure 182.

In addition to creating an aesthetically pleasing surface, this construction produces a more durable conductive surface than conductive fabric alone due to the support of the laminated substrate 180. The laminated substrate 180 can be molded using heat and or compression to form the enclosure 182 which with appropriate design and overlapping seams, to eliminate the need to sew the conductive material 184, which can potentially damage it or weaken the protective property. In addition, the foam substrate enclosure 182 has many additional benefits such as allowing for joints or junctions 192 to be easily fastened to the enclosure 182 through an orifice 200 with overlapping fabric which will maintain the Faraday integrity of the enclosure 182 while providing electricity or data between a device inside of the enclosure 182 and a device (such as a battery or a computer) outside of the enclosure without compromising the Faraday shielding property of the enclosure. In some embodiments, a dividing wall 202 may be provided to create a second compartment to house batteries, cables, or other devices within the enclosure 182. The dividing wall 202 may have a slit or opening 204 through which cables and the like can be inserted to connect with the device.

The foam substrate 180 also provides a level of physical protection against bumping or crushing the devices 10 inside of the enclosure 182 that current Faraday bags do not. The semi-rigid nature of the enclosure 182 is lighter and more flexible than current metal boxes used to provide Faraday shielding while providing more structure and form, and protection to enclose devices 10 than bags which are currently manufactured out of conductive material for such purposes. An additional benefit to the fabric-plastic laminate construction is that the formed foam substrate can suspend the conductive fabric on the inside of the enclosure 182 minimizing the contact of the fabric 184 to touch-screen surfaces 20 of devices 10 inside the enclosure 182. The suspension of the conductive fabric 184 off of the device 10 can allow making for better operation of a touchscreen 20 inside of the enclosure 182 by means of either pressing through the semi-rigid enclosure 182 with a finger or by the use of a stylus inside of the enclosure 182 (manipulated with a magnet) without need of any additional frame or cradle inside the bag to suspend the fabric. A transparent or semi-transparent conductive fabric 194 can be laminated to a transparent substrate (plastic or glass) material 196 to create a viewable window that, when properly installed with overlapping conductive fabric 194 at its seems will allow a device 10 to be viewed and manipulated within the enclosure 182 while maintaining an effective continuous Faraday shield.

These features should be considered novel when used in any combination or order. The following describes possible uses of the present invention.

In one aspect, a portable wireless device 10 is seized, and device cable 14 is connected to portable wireless device 10, and the other end of the device cable 14 already connected to portable wireless device is connected to filter box 140 as shown in FIG. 4B. Then, a portable wireless device 10 is placed inside of EMI enclosure 102 and the EMI enclosure 102 is placed inside of transport bag 172. The EMI enclosure 102 is removed from the transport bag 172, and a metallic unit 134 is inserted into data acquisition or charging device. As a result, the device 10 inside of EMI enclosure 102 interacts with external acquisition or charging device through cable connection.

In another aspect, a portable touchscreen wireless device 10 is seized, and the portable touchscreen wireless device 10 is placed inside of cradle 160. Then, a device cable 14 is connected to portable wireless device and the other end of the device cable 14 is connected to filter box 140. The portable wireless device 10 is placed inside of the EMI enclosure 102, and the EMI enclosure 102 is placed inside of transport bag 172. Next, the EMI enclosure 102 is removed from transport bag 172, a metallic unit 134 is inserted into data acquisition or charging device, and the device 10 inside of EMI enclosure 102 interacts with external acquisition or charging device through cable connection. The device 10 inside of EMI enclosure 102 can be human-operated by system of magnets 144, 146 and stylus 147.

In another aspect, a portable touchscreen wireless device 10 is seized and the portable touchscreen wireless device 10 is placed inside of cradle 160. A cable 14 is connected to the portable wireless device 10, and the other end of cable is connected to filter box 140. The portable wireless device 10 is placed inside of the EMI enclosure 102 and a metallic unit 134 is inserted into data acquisition or charging device. The device 10 inside of the EMI enclosure 102 interacts with external acquisition or charging device through cable connection, and the device inside of EMI enclosure can be human-operated by system of magnets 144, 146 and stylus 147.

Figure 11:
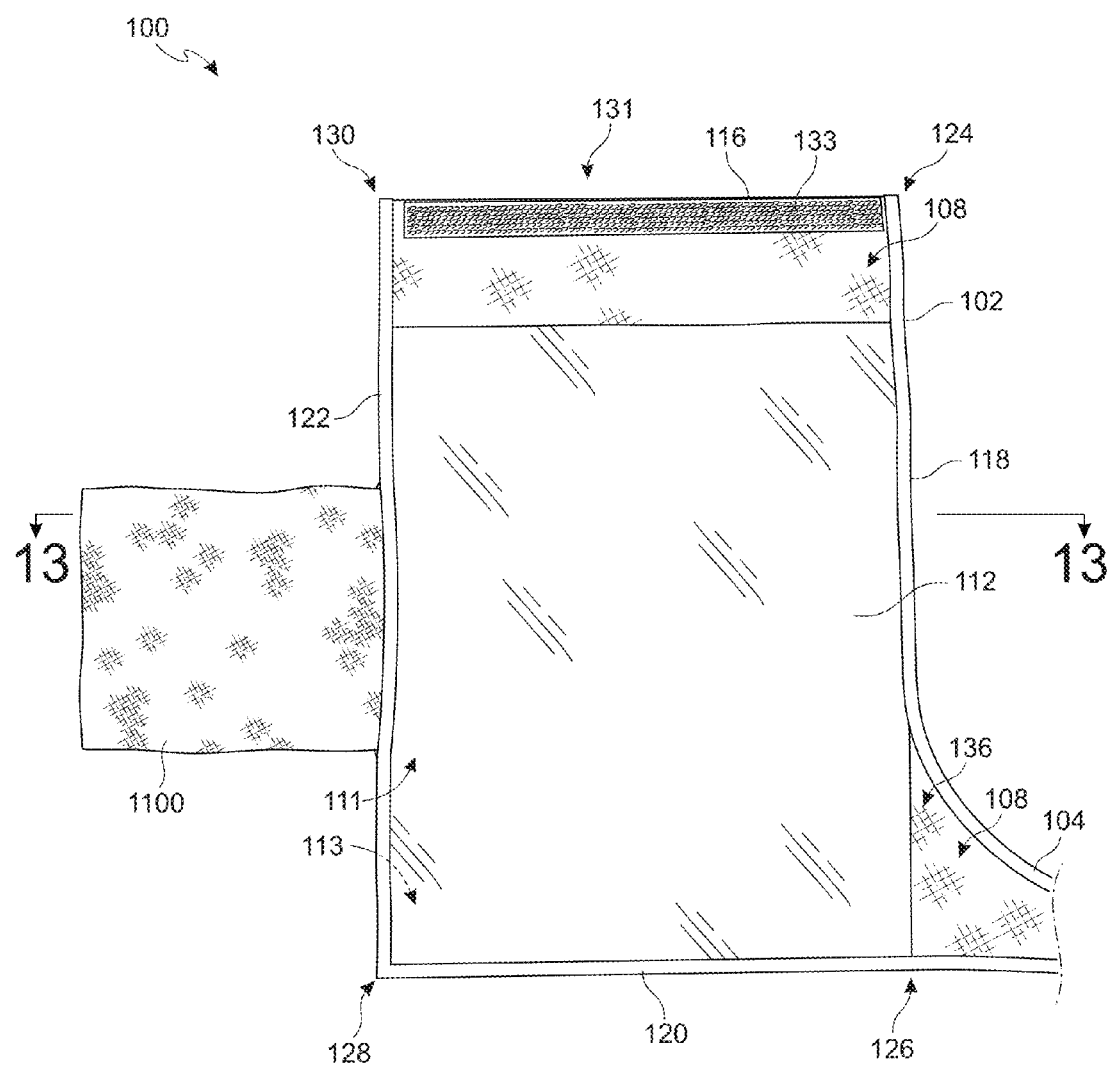
FIG. 11 is a top view of another embodiment of the present invention.

In another embodiment, as shown in FIG. 11, the EMI shield 100 discussed above may further comprise an auxiliary enclosure 1100 attached to the main enclosure 102, wherein the auxiliary enclosure 1100 has the same or similar shielding properties as the main enclosure 102. In the preferred embodiment, the auxiliary enclosure 1100 is made of an elastic Faraday fabric, such as the Technik-tex P 130+B made by Shieldex®. Preferably, the auxiliary enclosure 1100 is in the form of a pouch, and more preferably, a fingerless pouch having one main cavity. Thus, the main enclosure 102 may still comprise the outer or protective layer 108, inner or shielding layer 110 enveloped by the outer layer 108, and first opening 116 to receive the electronic device 10 into the inner layer 110. In addition, however, the main enclosure 102 may further comprise a second opening 1102. The auxiliary enclosure 1100 may be attached to the main enclosure 102 at the second opening 1102. Since the auxiliary enclosure 1100 has the same or similar shielding properties as the main enclosure 102, in particular, the inner layer 110, an electronic device 10 placed inside the main enclosure 102 is still protected from electromagnetic interference trying to enter through the second opening 1102, due to the presence of the auxiliary enclosure 1100.

To maintain the integrity of the shielding effect, the auxiliary enclosure 1100 is attached, by what is referred to as a shielded seam 1111, to the main enclosure 102 at the second opening 1102 in a manner that prevents electromagnetic interference from entering through the second opening 1102. In the preferred embodiment, the shielded seam 1111 is created on the inside of the main enclosure 102 so there is sufficient overlap with the shielding layer 110 of the main enclosure 102 to maintain the integrity of the shielding effect within the auxiliary enclosure 1100. Preferably, the auxiliary enclosure 1100 is sewn into the main enclosure 102. However, other means of fastening the auxiliary enclosure 1100 to the main enclosure 102 can be used, such as with adhesives, staples, and the like, so long as measures are taken so that the magnetic interference cannot enter the main enclosure 102 or the auxiliary enclosure 1100 through the seams. In some embodiments, the auxiliary enclosure 1100 may be integrally formed with the main enclosure 102.

In the preferred embodiment, the second opening 1102 is created by separating two adjacent edges 1104, 1106 of the main enclosure 102. The separation is then sealed with the auxiliary enclosure 1100. Combining one-way or two-way stretch metalized fabric with non-elastic Faraday fabric is technically more difficult than sewing completely non-elastic fabric. When elastic Faraday fabric is stretched, shielding levels may be reduced by up to 40%, depending on how much the material is stretched. To maintain the highest shielding, the fabric cannot be stretched during manufacture, which is a difficult task when sewing multiple layers and adding seam binding 1112. The typical method is to pull the fabric along with the seam binding 1112.

Figure 12:
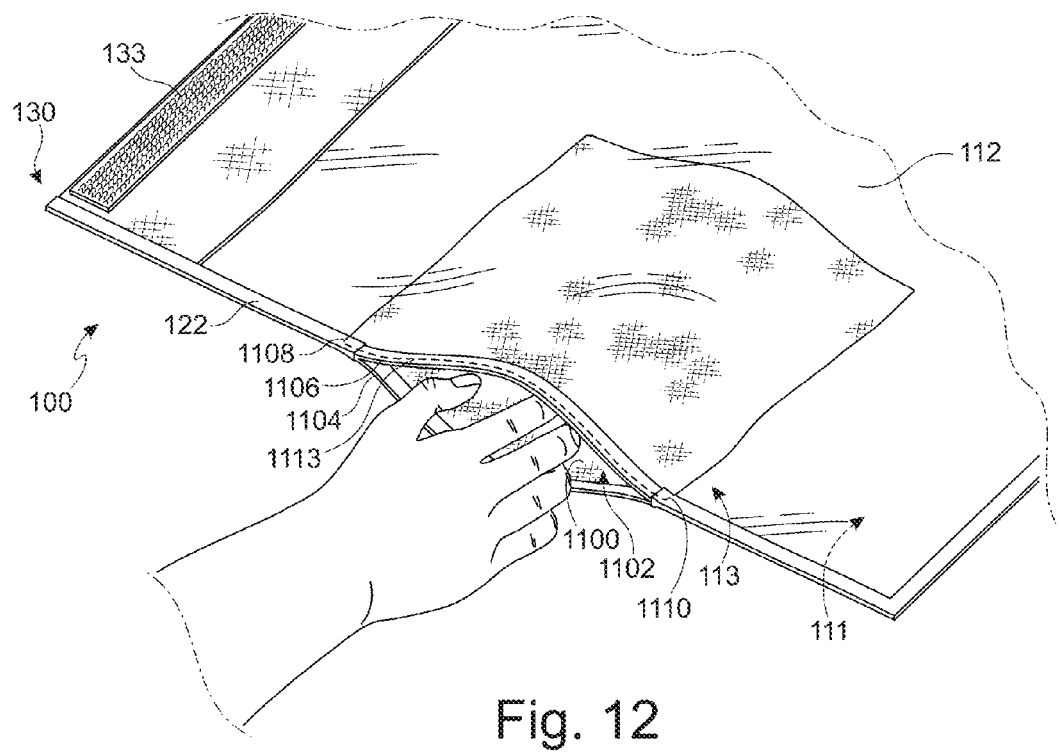
FIG. 12 is a partial perspective view of the embodiment of FIG. 11.

The method in the present application involves tacking the elastic Faraday fabric material first, to maintain position of the material and minimize stretching. To assure proper overlap, the portion of the auxiliary enclosure 1100 fastened to the main enclosure 102 is larger than the second opening 1102, as shown in FIG. 12. A specific type of construction ensures that all Faraday material terminations or junctions in the auxiliary enclosure 1100 are overlapped and sewn with other Faraday material in the main enclosure 102. If any terminations are left open, the shielding effectiveness of the bag will be reduced partially or completely. For example, the two outer edges 1108, 1110 of the auxiliary enclosure 1100 are sewn directly into the shielding layers 110 of Faraday fabric in the main enclosure 102. The inner edges of the auxiliary enclosure are sewn into the two separate layers of Faraday fabric in the main enclosure 102. A first seam binding 1112 may cover the inner edge 1113 of the auxiliary enclosure, but they should terminate slightly before the outer edges 1108, 1110 of the auxiliary enclosure. This allows the seam bindings 1115 on the outer edges 1108, 1110 to "squeeze" together and make contact with the two layers of Faraday fabric in the main cavity, ensuring conductivity between all layers.

Therefore, once properly sealed, the auxiliary enclosure 1100 basically becomes an extension of the main enclosure 102 while offering more flexibility in accommodating larger or irregularly formed devices. Antennas on routers, for example, may impede placement of the router in a typical Faraday bag. The auxiliary enclosure 1100 provides a space for the antenna to fit. In addition, the auxiliary enclosure 1100 may hold batteries connected to devices, forensic products collected to phones, or any other irregularly shaped object.

With regards to the main enclosure 102, any of the features described above for the previous embodiments can be utilized with the embodiment having the auxiliary enclosure, such as the transparent windows 112, outer layer 108, inner layer 110 enveloped by the outer layer 108, a first opening 116 to receive the electronic device into the inner layer 110, and sleeve 104.

Figure 13:
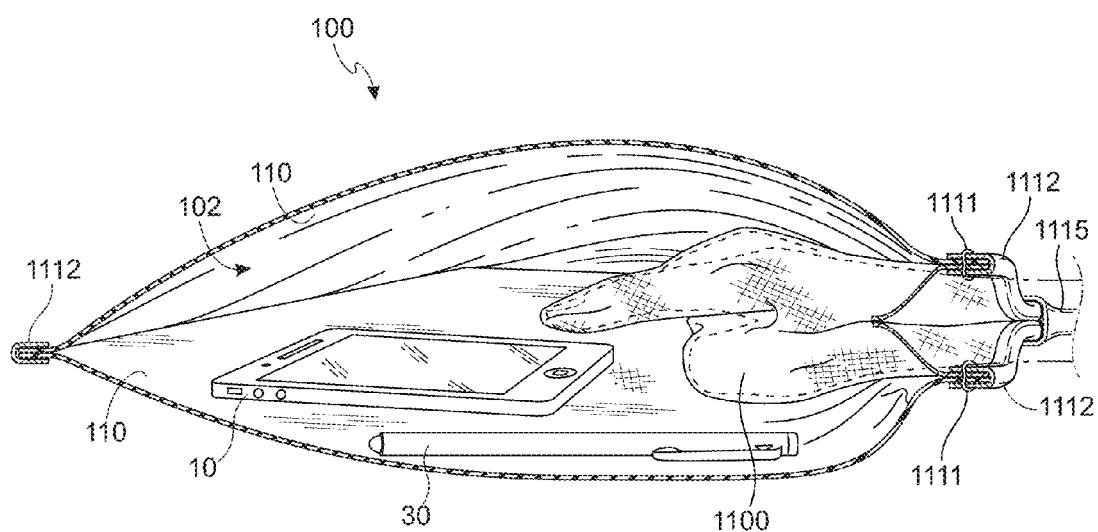
FIG. 13 is a cross-sectional view along line 13-13 in FIG. 11 while in use.

In use, once an electronic device 10 is placed in the main enclosure 102 through the first opening 116, the first opening 116 can be sealed. However, the electronic device 10 can still be accessed and used without exposure to EMI by inserting the user's hand into the auxiliary enclosure 1102 as shown in FIG. 12. To use the electronic device 10, a user can bunch the auxiliary enclosure 1100 into his hand, then insert his hand with the auxiliary enclosure 1100 into the main enclosure 102 while keeping the auxiliary enclosure 1102 taut as shown in FIG. 13. By keeping the auxiliary enclosure 1100 taut, the user can prevent loose or unintended portions of the auxiliary enclosure 1100 from touching electronic device 10. As the user continues to maneuver his hand towards electronic device 10, if the auxiliary enclosure 1100 becomes too taut, the user can slowly release portions of the auxiliary enclosure 1100 to reach deeper into the main enclosure 102. Once the user reaches electronic device 10, the user can perform an action on the electronic device 10 via the auxiliary enclosure 1100. For example, the user can extend one of his fingers to stretch a portion of the auxiliary enclosure 1102 to maintain tautness. This tautness allows the user to perform the action on the electronic device 10 with the finger without compromising the shielding and without allowing any other portion of the auxiliary pouch from touching the electronic device.

In another example, the user can grasp a secondary device 30 (such as a stylus or pen) inside the main enclosure 102 with the auxiliary enclosure 1100 while maintaining tautness of the auxiliary enclosure 1100. The user can then perform the action on the electronic device 10 with the secondary device 30 without compromising the shielding and without allowing any other portion of the auxiliary enclosure 1100 from touching the electronic device 10.

Figures 14, 15:
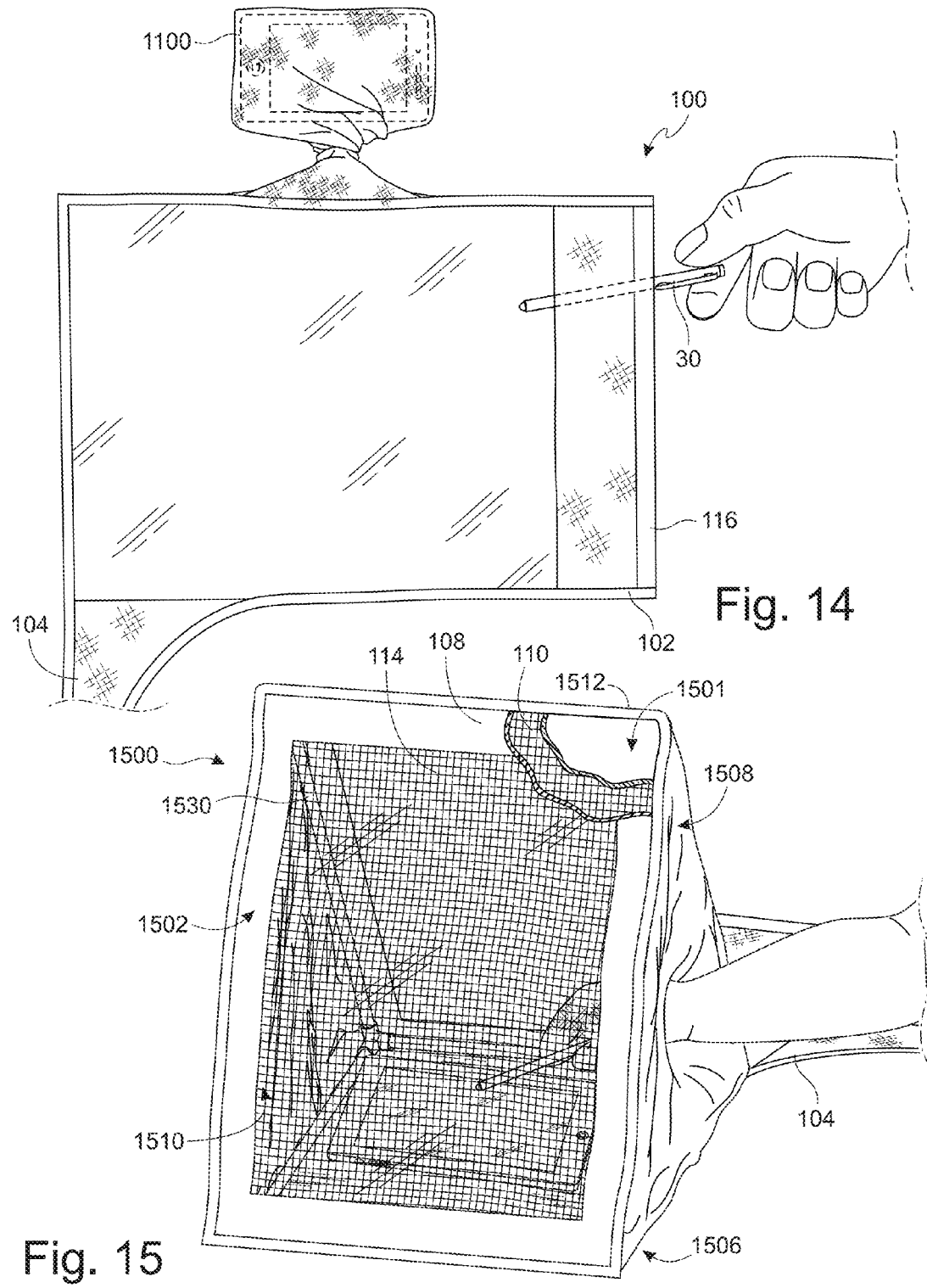
FIG. 14 is a top view of the embodiment shown in FIG. 11 with an electronic device isolated in an auxiliary enclosure.
FIG. 15 is a front perspective view of another embodiment of the present invention.

In another example, the user is able to add or remove additional devices 30 from the main enclosure 102 while maintaining the shielded protection of the electronic device 10 during the opening and closing of the main enclosure 102. For example, the user may insert his hand into the main enclosure 102 through the second opening 1102. The user can then grasp the electronic device 10 with the auxiliary enclosure 1100. The user can then remove the electronic device 10 from the main enclosure 102 while keeping the electronic device 10 enveloped in the auxiliary enclosure 1100 sufficiently to keep the electronic device 10 shielded. If desired, since the auxiliary enclosure 1100 is flexible, the user is able to twist the auxiliary enclosure 1100 at a point adjacent to the second opening 1102 so as to seal the electronic device 10 within the auxiliary enclosure 1100 irrespective of the main enclosure 102 as shown in FIG. 14. Now, the user is able to add a secondary device 30 into the main enclosure 102, or remove an existing secondary device 30 from the main enclosure 102, without exposing the electronic device 10 to EMI. Once the secondary device 30 is added or removed, the user can close and seal the first opening 116 as before. The auxiliary enclosure 1100 containing the electronic device 110 can then be inserted back into the main enclosure 102, and released from the auxiliary enclosure 1100.

The existence of an auxiliary enclosure 1100 offers more versatility in accommodating large or irregular form factor devices inside the main enclosure 102. In some embodiments, multiple auxiliary enclosures 1100 may be attached to the main enclosure 102 in a manner similar to that discussed above.

Figure 16:
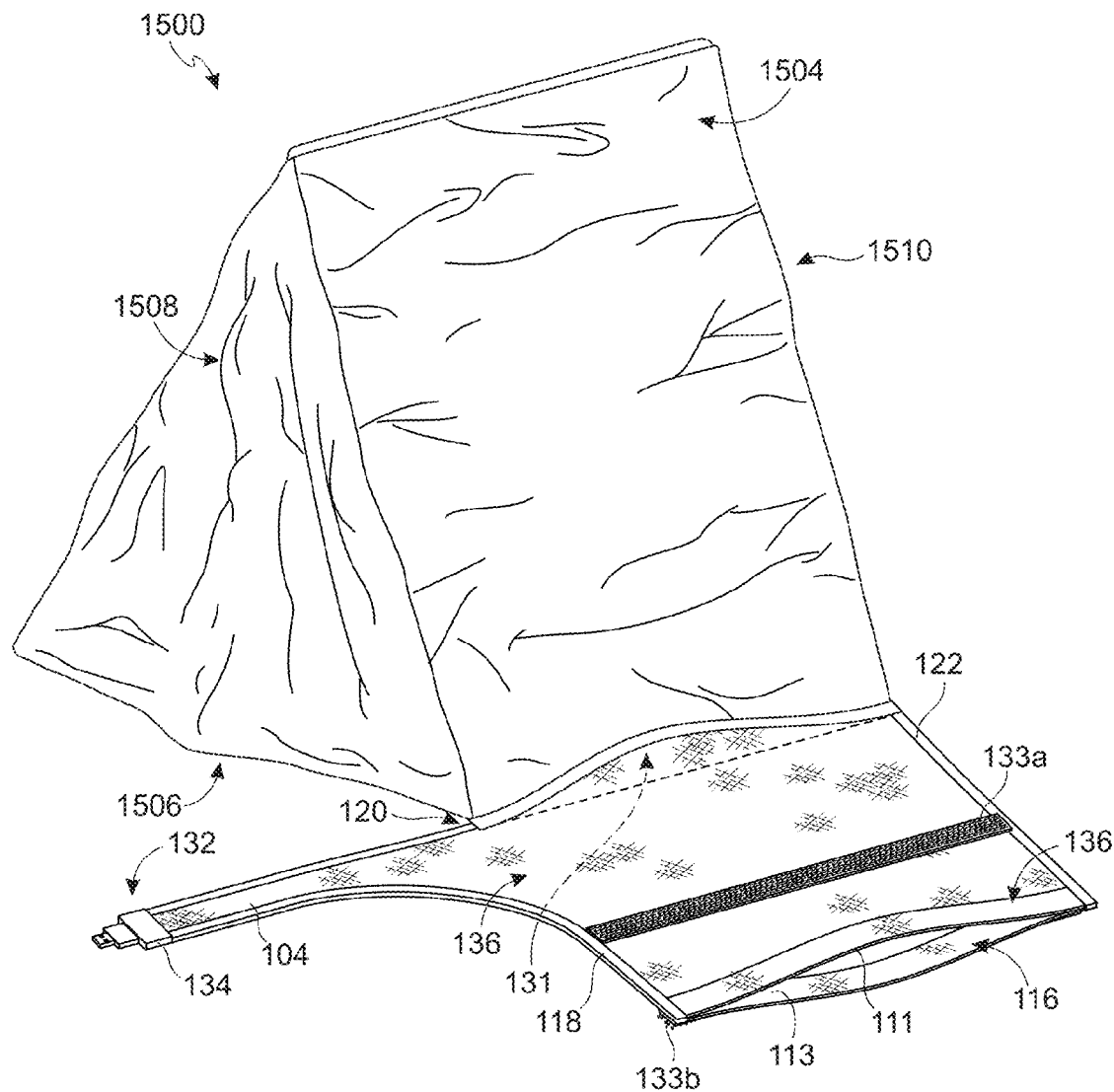
FIG. 16 is a rear perspective view of the embodiment shown in FIG. 15.

In another embodiment, the EMI shield may be in the form of a tent bag 1500 as shown in FIGS. 15-16. The tent bag 1500, like the previous embodiments, may be a complete isolation bag with no USB line filter sleeve 104, or it may have an option for a USB line filter sleeve 104 as shown and described for the previous embodiments (e.g. FIG. 1A). This variation provides an advantage over a traditional Faraday bag because the form factor allows larger devices (such as a laptop or table) to be placed inside. The tent 1500 can be made of flexible shielding material so that it can fold into a small flat or rolled up form.

In the preferred embodiment, the tent bag 1500 has a triangular shape, having a front side 1502, a back side 1504 opposite the front side 1502, a bottom side 1506 adjacent to the front 1502 and back side 1504, and two sides 1508, 1510, preferably having a triangular shape, opposite each other and adjacent to the front 1502, back 1504, and bottom side 1506, thereby defining the main cavity 1501. Being triangular in shape, the front side 1502 and the back side 1504 are attached to each other at the top 1512. However, other shapes can be used such as box shape, pentagon shapes, spherical shapes, and the like, and any combination thereof.

All sides comprise the same shielding layer 110 material and are manufactured in a similar way so as to assure that the interior of the tent bag 1500 is completely shielded from EMI as discussed in the previous embodiments. The shielding layer 110 may also be covered by an outer layer 108, like the previous embodiments. The front side 1502 may also have a transparent portion 114 so that the electronic device 10 inside the cavity 1501 of tent bag 1500 can be seen. This allows the user to use the electronic device 10 inside the tent bag 1500 while maintaining the integrity of the shielding. In addition, the electronic devices 10 can be photographed while being operated inside.

An opening 131 may be created at any intersection of any of the sides. Preferably, the opening 131 is created where the back side 1504 and the bottom side 1506 meet. A protective layer 108 with two opposing surface layers 111, 113 may be fastened to the tent bag 1500 with one layer 111 attached to the back 1504 and the second layer 113 attached to the bottom side 1506. The two layers 111, 113 can be attached to each other along the two opposite 118, 122 sides leaving open side 116 to create a passage to the opening 131. The same fastening mechanism 133 as discussed in previous embodiments may be used to close the open side 116. Therefore, a strip of the hook portion 133a may be on the first surface 111 along the length of the first surface 111, but shifted away from the open side 116, and a strip of the loop portion 133b approximately the same length as the hook portion 133a may be on the second surface 113, but directly adjacent to the open side 116. The distance of the shift may be just over two widths of the strip of the loop portion 133b so that when the strip of the loop portion 133b is folded over towards the first surface 111 twice, the strip of the loop portion 133b mates with the strip of the hook portion 133a. The strip of the hook portion 133a and the loop portion 133b can also be reversed. In essence the tent bag 1500 may be attached to a modified version of the main enclosure 102 described for FIG. 1A-1B. The modification would be in terms of its size, and the presence of an opening at one of the sides (e.g. side 120) so that there can be fluid communication from the opening 116 to the cavity 1501 of the tent bag 1500.

In embodiments of the tent bag 1500 having the sleeve 104, the sleeve 104 may be attached to the protective layer 108 at one of the sides 118, 122 like the previous embodiments (e.g. FIG. 1A). Therefore, the sleeve 104 may have the same or similar outer or protective layer 108 and the same or similar inner or shielding layer 110. An auxiliary cable 12 may be inserted through the sleeves 104 to provide a means for connecting to the electronic device 10 inside the cavity 1501.

Of the two sides 1508, 1510, at least one side 1508 or 1510 and preferably both sides 1508, 1510 are made of the elastic Faraday fabric used for the auxiliary enclosure 1100. This allows a user to operate or manipulate devices 10 from one or two sides of the cavity 1501 with one or both hands, if desired, similarly as described for the auxiliary enclosure 1100 above. Therefore, like the embodiment with the auxiliary enclosure 1100 discussed above, an electronic device 10 already inside the main cavity 1501 can be temporarily removed while maintaining shielding by grasping the electronic device 10 with one of the sides 1508 or 1510, and twisting the side to wrap up the electronic device 10. This allows the user to add or remove additional devices 30 through the primary opening 116 or secondary opening 1520 without exposing the electronic device 10 to any EMI. Therefore, the elastic sides 1508 or 1510 are equivalent to the auxiliary enclosure 1100 and the cavity 1501 is equivalent to the main enclosure 102. To ensure the integrity of the shielding effect, the two sides 1508, 1510 are attached to the front side 1502, back side 1504, and bottom side 1506 using the same type of overlapping stitching technique as discussed above for the auxiliary enclosure 1100.

In some embodiments, a frame 1530 may be provided to maintain the shape of the tent bag 1500 in the open configuration. Removal of the frame 1530 will allow the tent bag 1500 to be folded, rolled, or otherwise collapsed into a convenient, transportable, or storable shape.

While the present invention has been described with regards to particular embodiments, it is recognized that additional variations of the present invention may be devised without departing from the inventive concept. Antennas on routers, for example, may impede placement of the router in a typical Faraday bag or in Faraday containers having hard shell walls. Such portions of the electronic device that does not fit well in the main enclosure may protrude out through the auxiliary enclosure. The auxiliary enclosure may hold secondary devices such as batteries connected to devices, forensic products connected to phones, or any other irregularly shaped objects.

INDUSTRIAL APPLICABILITY

This invention may be industrially applied to the development, manufacture, and use of EMI enclosures, and more specifically relates to portable EMI enclosures for use in shielding electronics from EMI and wireless communication signals.

What is claimed is:

1. An electromagnetic interference (EMI) shield, comprising:
 (a) a main enclosure to shield an electronic device from electromagnetic interference, the enclosure, comprising:
  i. a protective layer having a transparent window,
  ii. a shielding layer having a transparent portion overlapping the transparent window,
  iii. a first opening to receive the electronic device, and
  iv. an orifice through which a device cable connectable to the electronic device can exit;
 (b) a sleeve having a first end and a second end opposite the first end, the first end of the sleeve operatively associated with the enclosure for accessing and connecting to the electronic device while the electronic device is inside the enclosure, without compromising shielding from the electromagnetic interference, the sleeve, comprising:
  i. an inner layer for shielding;
  ii. an auxiliary cable housed inside the sleeve, the auxiliary cable, comprising a first cable-end connection at a first end and a second cable-end connection at a second end;
  iii. a metallic unit fastened to the second end of the sleeve, the metallic unit mated with the second cable-end connection;
  iv. an EMI filter connected to the first cable-end connection, wherein the first cable-end connector is connectable to the device cable; and
 c. an auxiliary enclosure attached to a second opening in the main enclosure, the auxiliary enclosure fastened to the main enclosure with a shielded seam, the auxiliary enclosure made of a shielding material.

2. The EMI shield of claim 1, wherein the auxiliary enclosure is a fingerless pouch.

3. The EMI shield of claim 1, wherein the auxiliary enclosure is elastic.

4. The EMI shield of claim 1, wherein the main enclosure has a triangular cross-section defined by a front side, a back side opposite the front side, a bottom side adjacent and attached to the front side and the back side, and two sides opposite each other and attached to the front side, the back side, and the bottom side, wherein one side is the auxiliary enclosure.

5. The EMI shield of claim 4, where in the two sides are made of elastic Faraday material.

6. A method of using an electromagnetic interference (EMI) shield, comprising:
  a. being provided with the EMI shield, the EMI shield comprising:
    i. a main enclosure to shield an electronic device from electromagnetic interference, the enclosure, comprising: an outer layer having a transparent window, an inner layer having a transparent portion overlapping the transparent window, a first opening to receive the electronic device, and a second opening through which a device cable connectable to the electronic device can exit;
    ii. a sleeve having a first end and a second end opposite the first end, the first end of the sleeve operatively associated with the enclosure for accessing and connecting to the electronic device while the electronic device is inside the enclosure, without compromising shielding from the electromagnetic interference, the sleeve, comprising an inner layer for shielding, an auxiliary cable housed inside the sleeve, the auxiliary cable, comprising a first cable-end connection at a first end and a second cable-end connection at a second end, a metallic unit fastened to the second end of the sleeve, the metallic unit mated with the second cable-end connection, an EMI filter connected to the first cable-end connection, wherein the first cable-end connector is connectable to the device cable; and
    iii. an auxiliary pouch attached to a second opening in the main enclosure, the auxiliary pouch fastened to the main enclosure with a shielded seam, the auxiliary pouch made of a shielding material;
  b. placing the electronic device through the first opening into the main enclosure of the EMI shield; and
  c. sealing the first opening.

7. The method of claim 6, further comprising:
  a. bunching the auxiliary pouch into a user's hand;
  b. inserting the user's hand with the auxiliary pouch into the main enclosure while keeping the auxiliary pouch taut;
  c. performing an action on the electronic device via the auxiliary pouch.

8. The method of claim 7, further comprising slowly releasing portions of the auxiliary pouch to reach deeper into the main enclosure.

9. The method of claim 7, further comprising
  a. extending a finger of the user to stretch a portion of the auxiliary pouch to maintain tautness; and
  b. performing the action on the electronic device with the finger without compromising the shielding and without allowing any other portion of the auxiliary pouch from touching the electronic device.

10. The method of claim 7, further comprising:
  a. grasping a secondary device inside the main enclosure with the auxiliary pouch while maintaining tautness of the auxiliary pouch; and
  b. performing the action on the electronic device with the secondary device without compromising the shielding and without allowing any other portion of the auxiliary pouch from touching the electronic device.

11. The method of claim 6, further comprising:
  a. inserting a user's hand into the main enclosure through the second opening;
  b. grasping the electronic device with the auxiliary pouch; and
  c. removing the electronic device from the main enclosure while keeping the electronic device enveloped in the auxiliary pouch sufficiently to keep the electronic device shielded from the main enclosure.

12. The method of claim 11, further comprising:
  a. opening the main enclosure at the first opening to insert or remove a second device;
  b. inserting or removing a second device into or from the main enclosure, respectively;
  c. closing and sealing the first opening;
  d. inserting the auxiliary pouch back into the main enclosure; and
  e. releasing the electronic device from the auxiliary pouch.

* * * * *